US009378842B2

(12) United States Patent
Lee et al.

(10) Patent No.: US 9,378,842 B2
(45) Date of Patent: Jun. 28, 2016

(54) BIDIRECTIONAL SHIFT REGISTER

(71) Applicant: LG Display Co., Ltd., Seoul (KR)

(72) Inventors: Ji-No Lee, Paju-si (KR); Sang-Myung Ha, Seoul (KR); Tae-Sang Kim, Anyang-si (KR); Jong-Kyung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 157 days.

(21) Appl. No.: 14/231,156

(22) Filed: Mar. 31, 2014

(65) Prior Publication Data

US 2014/0211907 A1 Jul. 31, 2014

Related U.S. Application Data

(62) Division of application No. 13/631,227, filed on Sep. 28, 2012, now Pat. No. 8,724,770.

(30) Foreign Application Priority Data

Oct. 4, 2011 (KR) ........................ 10-2011-0100521

(51) Int. Cl.
*G11C 19/00* (2006.01)
*G11C 19/28* (2006.01)
(52) U.S. Cl.
CPC ........ *G11C 19/28* (2013.01); *G09G 2310/0286* (2013.01)
(58) Field of Classification Search
None
See application file for complete search history.

(56) References Cited

U.S. PATENT DOCUMENTS

| | | | | |
|---|---|---|---|---|
| 5,282,234 A * | 1/1994 | Murayama et al. | ............. | 377/69 |
| 5,894,296 A | 4/1999 | Maekawa | | |
| 6,646,465 B2 * | 11/2003 | Bal | ................. | 326/40 |
| 6,996,203 B2 * | 2/2006 | Onda et al. | ...................... | 377/75 |
| 7,106,292 B2 * | 9/2006 | Moon | ........................... | 345/100 |
| 7,627,076 B2 | 12/2009 | Tobita | | |
| 7,636,412 B2 * | 12/2009 | Tobita | ............................ | 377/64 |

(Continued)

FOREIGN PATENT DOCUMENTS

| | | |
|---|---|---|
| CN | 1545099 A | 11/2004 |
| CN | 101989463 | 3/2011 |

(Continued)

OTHER PUBLICATIONS

European Patent Office, European Search Report and Opinion, European Patent Application No. 12187016.6, Oct. 10, 2013, seven pages.

(Continued)

*Primary Examiner* — Tuan T Lam
(74) *Attorney, Agent, or Firm* — Fenwick & West LLP

(57) ABSTRACT

Disclosed herein is a bidirectional shift register which is capable of preventing multi-outputs from both end stages. The shift register includes a plurality of stages for outputting scan pulses forward or reversely based on a start pulse and a plurality of clock pulses with a phase difference. A last one of the stages includes a forward scan controller for making a set node active and a reset node inactive based on any one of the clock pulses and a scan pulse from an upstream stage, a reverse scan controller for making the set node active and the reset node inactive based on any one of the clock pulses and the start pulse, and an output unit for outputting any one of a corresponding scan pulse and a deactivation voltage based on a voltage at the set node, a voltage at the reset node and any one of the clock pulses.

13 Claims, 15 Drawing Sheets

(56) References Cited

U.S. PATENT DOCUMENTS

| | | | |
|---|---|---|---|
| 8,526,569 B2 | 9/2013 | Jang et al. | |
| 8,537,095 B2* | 9/2013 | Lee et al. | 345/100 |
| 8,548,115 B2 | 10/2013 | Shang | |
| 8,571,169 B2 | 10/2013 | Tobita | |
| 8,571,170 B2 | 10/2013 | Tobita | |
| 2005/0084059 A1 | 4/2005 | Yu | |
| 2006/0256066 A1* | 11/2006 | Moon | 345/100 |
| 2006/0269038 A1* | 11/2006 | Jang et al. | 377/64 |
| 2007/0297559 A1 | 12/2007 | Cho et al. | |
| 2010/0220082 A1* | 9/2010 | Lin et al. | 345/205 |
| 2011/0007040 A1* | 1/2011 | John et al. | 345/204 |
| 2011/0228894 A1* | 9/2011 | Wang et al. | 377/80 |
| 2012/0114092 A1 | 5/2012 | Kim | |
| 2013/0077736 A1* | 3/2013 | Son | 377/69 |
| 2013/0169609 A1* | 7/2013 | Son et al. | 345/209 |

FOREIGN PATENT DOCUMENTS

| | | |
|---|---|---|
| CN | 102087827 A | 6/2011 |
| EP | 0 631 289 A2 | 12/1994 |
| JP | 2001-134240 | 5/2001 |
| JP | 2002-352593 | 12/2002 |

OTHER PUBLICATIONS

State Intellectual Property Office of the People's Republic of China, First Office Action, Chinese Patent Application No. 201210374740.2, Dec. 29, 2014, sixteen pages.

Office Action for Chinese Patent Application No. CN 201210374740.2, Aug. 24, 2015, 18 Pages.

* cited by examiner (a)

(b)

(a)                  (b)

US 9,378,842 B2

BIDIRECTIONAL SHIFT REGISTER

CROSS-REFERENCE TO RELATED APPLICATIONS

This application is a divisional application under 35 U.S.C. §121 of, and claims priority under 35 U.S.C. §120 from, U.S. patent application Ser. No. 13/631,227 filed on Sep. 28, 2012 and entitled "Bidirectional Shift Register," which claims the benefit under 35 U.S.C. §119(a) of Korean Patent Application No. 10-2011-0100521, filed on Oct. 4, 2011, both of which are hereby incorporated by reference in their entirety as if fully set forth herein.

BACKGROUND OF THE INVENTION

1. Field of the Invention

The present invention relates to a shift register, and more particularly, to a bidirectional shift register which is capable of preventing multi-outputs from both end stages.

2. Discussion of the Related Art

A bidirectional shift register, which is capable of outputting scan pulses forward or reversely, includes a plurality of stages. In particular, a start pulse is always supplied to a first stage and a last stage at the beginning of driving irrespective of forward driving or reverse driving.

For this reason, in the forward driving, a set node of the last stage floats by the start pulse, resulting in a multi-output problem that the last stage outputs two scan pulses for one frame period. Likewise, in the reverse driving, a set node of the first stage floats by the start pulse, resulting in a multi-output problem that the first stage outputs two scan pulses for one frame period.

As a result, a last gate line connected to an output terminal of the last stage is periodically driven, thereby causing pixels connected to the gate line to emit light with higher luminance than other pixels. In particular, when data corresponding to black is supplied to all pixels with light emitting elements, an end line brightening phenomenon occurs in which pixels connected to an end line become brighter than pixels connected to other gate lines. This phenomenon is more prominent at a high temperature at which the threshold voltage of a pull-up switching device is liable to be shifted.

SUMMARY

Embodiments of the present invention include a bidirectional shift register in which only a first stage is set in forward driving and only a last stage is set in reverse driving, thereby preventing generation of a multi-output from any one stage in the forward driving and reverse driving and thus improving picture quality of a display device employing this shift register.

In one embodiment, a bidirectional shift register includes a plurality of stages for outputting scan pulses forward or reversely based on a start pulse and a plurality of clock pulses with a phase difference, wherein a last one of the stages outputs a corresponding one of the scan pulses last of all in a forward mode where the bidirectional shift register outputs the scan pulses forward, the last stage including a forward scan controller for making a set node of the last stage active and a reset node of the last stage inactive based on any one of the clock pulses and a scan pulse from an upstream stage, a reverse scan controller for making the set node active and the reset node inactive based on any one of the clock pulses and the start pulse, an output unit for outputting any one of the corresponding scan pulse and a deactivation voltage based on a voltage at the set node, a voltage at the reset node, and any one of the clock pulses supplied thereto, and a deactivation prevention switching device controlled by a clock pulse having a phase different from that of the clock pulse supplied to the output unit, the deactivation prevention switching device preventing the reset node from being deactivated at a time that the clock pulse supplied to the output unit is applied to the output unit.

The forward scan controller of the last stage may include a first forward switching device controlled by the scan pulse from the upstream stage supplied thereto and connected between an activation transfer line transferring an activation voltage and a first node, at least one second forward switching device controlled by any one of the clock pulses supplied thereto and connected between the first node and the set node, and at least one third forward switching device controlled by the scan pulse from the upstream stage and connected between the reset node and a deactivation transfer line transferring the deactivation voltage, wherein the scan pulse supplied to the first forward switching device and the clock pulse supplied to the second forward switching device may be in synchronization with each other.

The reverse scan controller of the last stage may include a first reverse switching device controlled by the start pulse supplied thereto and connected between the activation transfer line transferring the activation voltage and a second node, at least one second reverse switching device controlled by any one of the clock pulses supplied thereto and connected between the second node and the set node, and at least one third reverse switching device controlled by the start pulse supplied thereto and connected between the reset node and a third node, wherein the start pulse supplied to the first reverse switching device and the clock pulse supplied to the second reverse switching device may be in synchronization with each other.

The deactivation prevention switching device of the last stage may be controlled by any one of the clock pulses supplied thereto and may be connected between the third node and the deactivation transfer line transferring the deactivation voltage, wherein the clock pulse supplied to the deactivation prevention switching device of the last stage may have a phase different from that of the start pulse supplied to the third reverse switching device.

The last stage may further include at least one first switching device controlled by the voltage at the reset node and connected between the set node and a deactivation transfer line transferring the deactivation voltage, at least one second switching device controlled by any one of the clock pulses and connected between an activation transfer line transferring an activation voltage and the reset node, and at least one third switching device controlled by the voltage at the set node and connected between the reset node and the deactivation transfer line.

The output unit of the last stage may include a pull-up switching device controlled by the voltage at the set node and connected between a clock transfer line transferring any one of the clock pulses and an output terminal of the last stage, and a pull-down switching device controlled by the voltage at the reset node and connected between the output terminal and a deactivation transfer line transferring the deactivation voltage.

Alternatively, the output unit of the last stage may include a plurality of pull-up switching devices controlled by the voltage at the set node and connected in parallel between a clock transfer line transferring any one of the clock pulses and an output terminal of the last stage, and a plurality of pull-down switching devices controlled by the voltage at the reset node and connected in parallel between the output terminal and a deactivation transfer line transferring the deactivation voltage.

A first one of the stages, which outputs a corresponding one of the scan pulses first of all in the forward mode where the bidirectional shift register outputs the scan pulses forward, includes a forward scan controller for making a set node of the first stage active and a reset node of the first stage inactive based on any one of the clock pulses and the start pulse, a reverse scan controller for making the set node of the first stage active and the reset node of the first stage inactive based on any one of the clock pulses and a scan pulse from a downstream stage, an output unit for outputting any one of the corresponding scan pulse and the deactivation voltage based on a voltage at the set node of the first stage, a voltage at the reset node of the first stage, and any one of the clock pulses supplied thereto, and a deactivation prevention switching device controlled by a clock pulse having a phase different from that of the clock pulse supplied to the output unit of the first stage, the deactivation prevention switching device of the first stage preventing the reset node of the first stage from being deactivated at a time that the clock pulse supplied to the output unit of the first stage is applied to the output unit of the first stage.

The forward scan controller of the first stage may include a first forward switching device controlled by the start pulse supplied thereto and connected between an activation transfer line transferring an activation voltage and a first node, at least one second forward switching device controlled by any one of the clock pulses supplied thereto and connected between the first node and the set node of the first stage, and at least one third forward switching device controlled by the start pulse supplied thereto and connected between the reset node of the first stage and a second node, wherein the start pulse supplied to the first forward switching device and the clock pulse supplied to the second forward switching device may be in synchronization with each other.

The deactivation prevention switching device of the first stage may be controlled by any one of the clock pulses supplied thereto and may be connected between the second node and a deactivation transfer line transferring the deactivation voltage, wherein the clock pulse supplied to the deactivation prevention switching device of the first stage may have a phase different from that of the start pulse supplied to the third forward switching device.

The reverse scan controller of the first stage may include a first reverse switching device controlled by the scan pulse from the downstream stage supplied thereto and connected between the activation transfer line transferring the activation voltage and a third node, at least one second reverse switching device controlled by any one of the clock pulses supplied thereto and connected between the third node and the set node of the first stage, and at least one third reverse switching device controlled by the scan pulse from the downstream stage and connected between the reset node of the first stage and a deactivation transfer line transferring the deactivation voltage, wherein the scan pulse supplied to the first reverse switching device and the clock pulse supplied to the second reverse switching device may be in synchronization with each other.

The first stage may further include at least one first switching device controlled by the voltage at the reset node of the first stage and connected between the set node of the first stage and a deactivation transfer line transferring the deactivation voltage, at least one second switching device controlled by any one of the clock pulses and connected between an activation transfer line transferring an activation voltage and the reset node of the first stage, and at least one third switching device controlled by the voltage at the set node of the first stage and connected between the reset node of the first stage and the deactivation transfer line.

The output unit of the first stage may include a pull-up switching device controlled by the voltage at the set node of the first stage and connected between a clock transfer line transferring any one of the clock pulses and an output terminal of the first stage, and a pull-down switching device controlled by the voltage at the reset node of the first stage and connected between the output terminal and a deactivation transfer line transferring the deactivation voltage.

Alternatively, the output unit of the first stage may include a plurality of pull-up switching devices controlled by the voltage at the set node of the first stage and connected in parallel between a clock transfer line transferring any one of the clock pulses and an output terminal of the first stage, and a plurality of pull-down switching devices controlled by the voltage at the reset node of the first stage and connected in parallel between the output terminal and a deactivation transfer line transferring the deactivation voltage.

Each of all the stages including the first stage and the last stage may further include at least one initialization switching device controlled by an external initialization signal and connected between a set node of a corresponding one of the stages and a deactivation transfer line transferring the deactivation voltage.

In accordance with another aspect of the present invention, a bidirectional shift register, which includes a plurality of stages for outputting scan pulses forward or reversely based on a start pulse and a plurality of clock pulses with a phase difference, further includes a start selector for supplying the start pulse to only a first one of the stages in a forward mode where the bidirectional shift register outputs the scan pulses forward, and to only a last one of the stages in a reverse mode where the bidirectional shift register outputs the scan pulses reversely, wherein the first stage outputs a corresponding one of the scan pulses first of all in the forward mode, wherein the last stage outputs a corresponding one of the scan pulses first of all in the reverse mode.

The start selector may include a forward selection switching device controlled by a start selection signal and connected between a start transfer line transferring the start pulse and the first stage, and a reverse selection switching device controlled by the start selection signal and connected between the start transfer line and the last stage, wherein logic of the start selection signal when the bidirectional shift register is driven in the forward mode and logic of the start selection signal when the bidirectional shift register is driven in the reverse mode may be opposite to each other, wherein the forward selection switching device and the reverse selection switching device may be transistors of opposite types.

The first stage may include a forward scan controller for making a set node active and a reset node inactive based on any one of the clock pulses and the start pulse from the forward selection switching device, a reverse scan controller for making the set node active and the reset node inactive based on any one of the clock pulses and a scan pulse from a downstream stage, and an output unit for outputting any one of the corresponding scan pulse and a deactivation voltage based on a voltage at the set node and a voltage at the reset node.

The forward scan controller of the first stage may include a first forward switching device controlled by the start pulse from the forward selection switching device supplied thereto and connected between an activation transfer line transferring an activation voltage and a first node, at least one second forward switching device controlled by any one of the clock pulses supplied thereto and connected between the first node and the set node, and at least one third forward switching device controlled by the start pulse from the forward selection switching device and connected between the reset node and a deactivation transfer line transferring the deactivation voltage, wherein the start pulse supplied to the first forward switching device and the clock pulse supplied to the second forward switching device may be in synchronization with each other.

The reverse scan controller of the first stage may include a first reverse switching device controlled by the scan pulse from the downstream stage supplied thereto and connected between the activation transfer line transferring the activation voltage and a second node, at least one second reverse switching device controlled by any one of the clock pulses supplied thereto and connected between the second node and the set node, and at least one third reverse switching device controlled by the scan pulse from the downstream stage and connected between the reset node and the deactivation transfer line transferring the deactivation voltage, wherein the scan pulse supplied to the first reverse switching device and the clock pulse supplied to the second reverse switching device may be in synchronization with each other.

The first stage may further include at least one first switching device controlled by the voltage at the reset node and connected between the set node and a deactivation transfer line transferring the deactivation voltage, at least one second switching device controlled by any one of the clock pulses and connected between an activation transfer line transferring an activation voltage and the reset node, and at least one third switching device controlled by the voltage at the set node and connected between the reset node and the deactivation transfer line.

The output unit of the first stage may include a pull-up switching device controlled by the voltage at the set node and connected between a clock transfer line transferring any one of the clock pulses and an output terminal of the first stage, and a pull-down switching device controlled by the voltage at the reset node and connected between the output terminal and a deactivation transfer line transferring the deactivation voltage.

Alternatively, the output unit of the first stage may include a plurality of pull-up switching devices controlled by the voltage at the set node and connected in parallel between a clock transfer line transferring any one of the clock pulses and an output terminal of the first stage, and a plurality of pull-down switching devices controlled by the voltage at the reset node and connected in parallel between the output terminal and a deactivation transfer line transferring the deactivation voltage.

The last stage may include a forward scan controller for making a set node active and a reset node inactive based on any one of the clock pulses and a scan pulse from an upstream stage, a reverse scan controller for making the set node active and the reset node inactive based on any one of the clock pulses and the start pulse from the reverse selection switching device, and an output unit for outputting any one of the corresponding scan pulse and a deactivation voltage based on a voltage at the set node and a voltage at the reset node.

The forward scan controller of the last stage may include a first forward switching device controlled by the scan pulse from the upstream stage supplied thereto and connected between an activation transfer line transferring an activation voltage and a first node, at least one second forward switching device controlled by any one of the clock pulses supplied thereto and connected between the first node and the set node, and at least one third forward switching device controlled by the scan pulse from the upstream stage and connected between the reset node and a deactivation transfer line transferring the deactivation voltage, wherein the scan pulse supplied to the first forward switching device and the clock pulse supplied to the second forward switching device may be in synchronization with each other.

The reverse scan controller of the last stage may include a first reverse switching device controlled by the start pulse from the reverse selection switching device supplied thereto and connected between the activation transfer line transferring the activation voltage and a second node, at least one second reverse switching device controlled by any one of the clock pulses supplied thereto and connected between the second node and the set node, and at least one third reverse switching device controlled by the start pulse from the reverse selection switching device and connected between the reset node and the deactivation transfer line transferring the deactivation voltage, wherein the start pulse supplied to the first reverse switching device and the clock pulse supplied to the second reverse switching device may be in synchronization with each other.

The last stage may further include at least one first switching device controlled by the voltage at the reset node and connected between the set node and a deactivation transfer line transferring the deactivation voltage, at least one second switching device controlled by any one of the clock pulses and connected between an activation transfer line transferring an activation voltage and the reset node, and at least one third switching device controlled by the voltage at the set node and connected between the reset node and the deactivation transfer line.

The output unit of the last stage may include a pull-up switching device controlled by the voltage at the set node and connected between a clock transfer line transferring any one of the clock pulses and an output terminal of the last stage, and a pull-down switching device controlled by the voltage at the reset node and connected between the output terminal and a deactivation transfer line transferring the deactivation voltage.

Alternatively, the output unit of the last stage may include a plurality of pull-up switching devices controlled by the voltage at the set node and connected in parallel between a clock transfer line transferring any one of the clock pulses and an output terminal of the last stage, and a plurality of pull-down switching devices controlled by the voltage at the reset node and connected in parallel between the output terminal and a deactivation transfer line transferring the deactivation voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EMBODIMENTS

Reference will now be made in detail to several embodiments, examples of which are illustrated in the accompanying drawings. Wherever possible, the same reference numbers will be used throughout the drawings to refer to the same or like parts.

Figure 1:
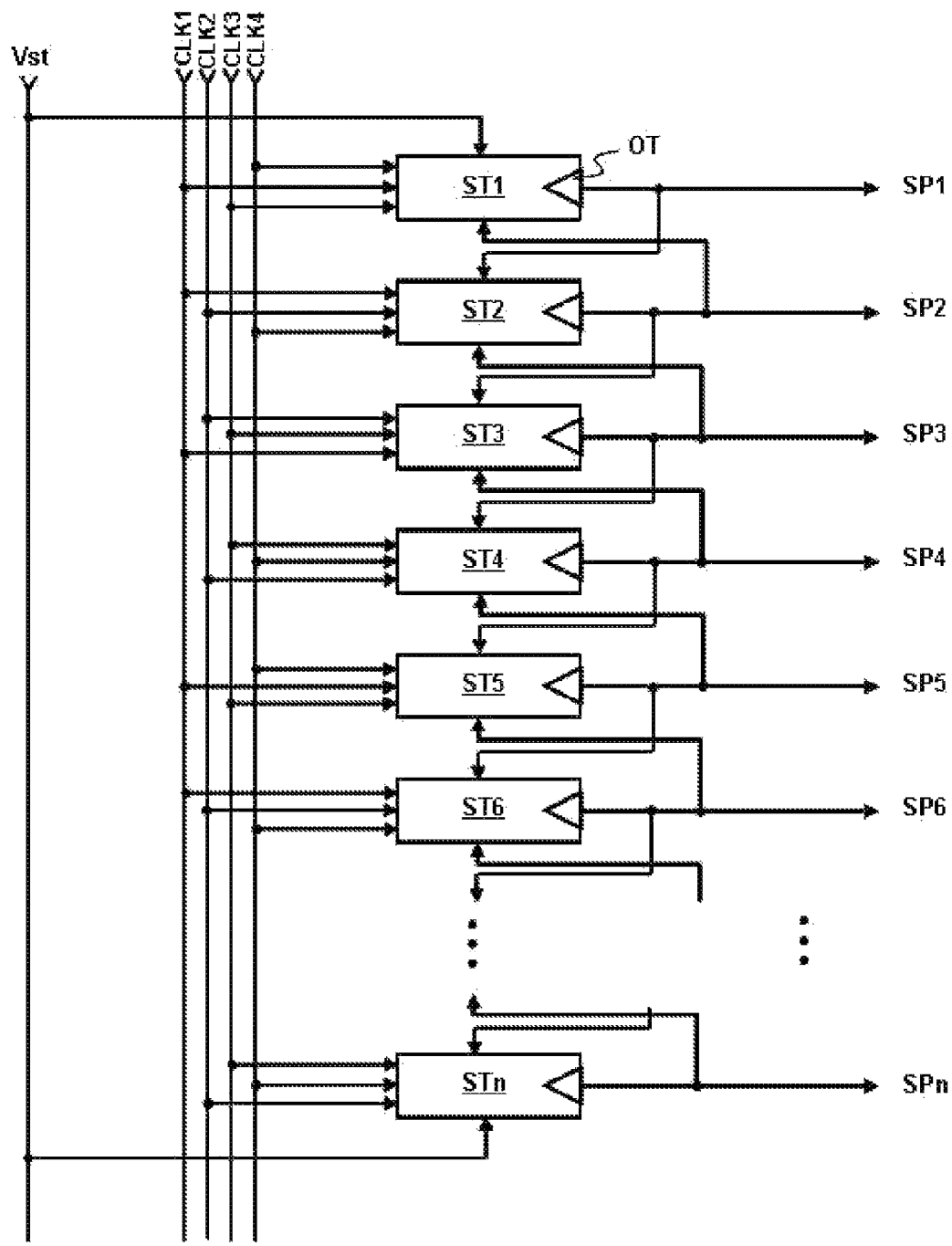
FIG. 1 is a block diagram showing the configuration of a bidirectional shift register according to a first embodiment of the present invention.
Figure 2A:
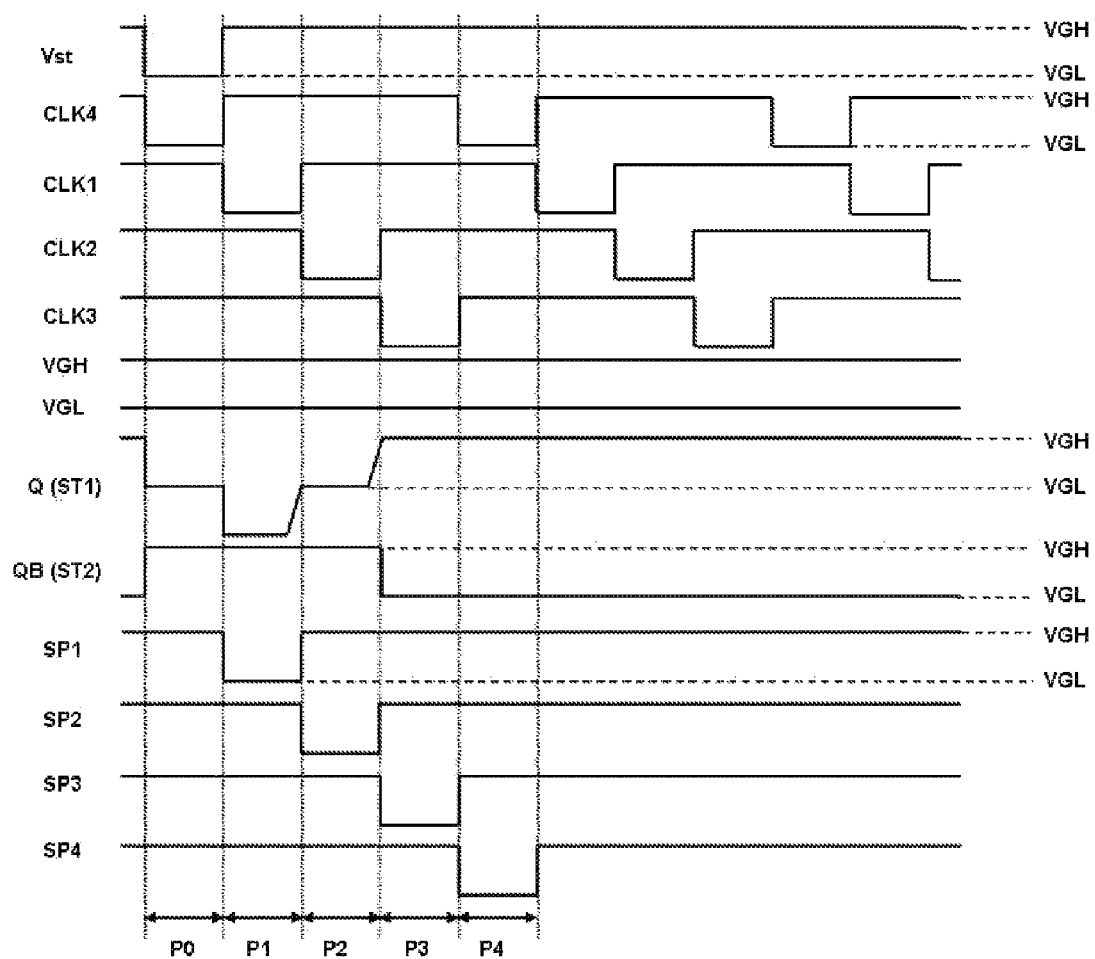
FIG. 2A is a timing diagram of various signals which are supplied to and output from the bidirectional shift register of FIG. 1 when this bidirectional shift register is driven in a forward mode.
Figure 2B:
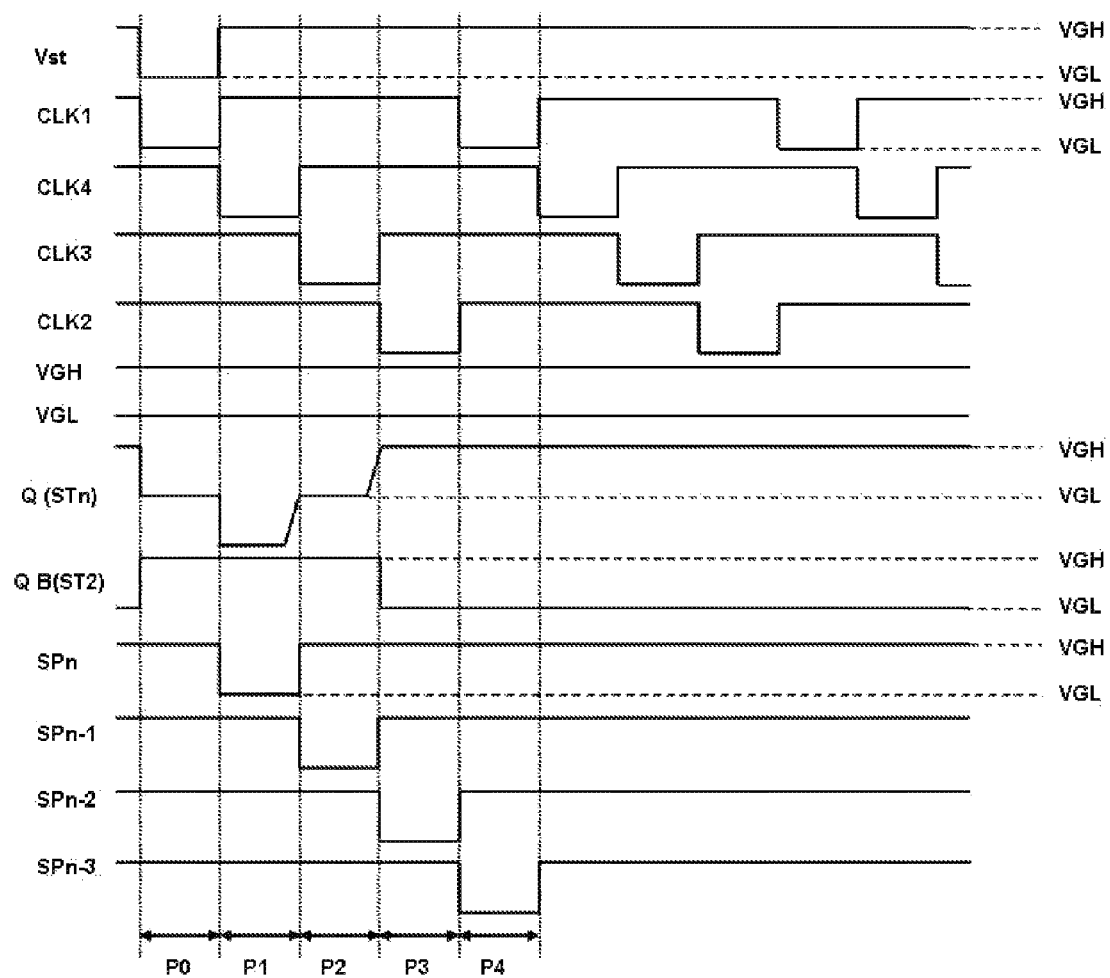
FIG. 2B is a timing diagram of various signals which are supplied to and output from the bidirectional shift register of FIG. 1 when this bidirectional shift register is driven in a reverse mode.

FIG. 1 is a block diagram showing the configuration of a bidirectional shift register according to a first embodiment of the present invention, FIG. 2A is a timing diagram of various signals which are supplied to and output from the bidirectional shift register of FIG. 1 when this bidirectional shift register is driven in a forward mode, and FIG. 2B is a timing diagram of various signals which are supplied to and output from the bidirectional shift register of FIG. 1 when this bidirectional shift register is driven in a reverse mode.

The bidirectional shift register according to the first embodiment of the present invention includes n stages ST1 to STn, as shown in FIG. 1. Each of the stages ST1 to STn outputs one scan pulse SP1 to SPn for one frame period through an output terminal OT thereof.

Each of the stages ST1 to STn drives a gate line connected thereto using the scan pulse. Also, each of the stages ST1 to STn controls the operations of a stage downstream therefrom and a stage upstream therefrom using the scan pulse.

When the shift register is driven in the forward mode, the stages ST1 to STn output the scan pulses in order from the first stage ST1 to the last stage STn. That is, the first stage ST1 outputs the first scan pulse SP1, the second stage ST2 then outputs the second scan pulse SP2, the third stage ST3 then outputs the third scan pulse SP3, . . . , and the last stage STn finally outputs the nth scan pulse SPn.

On the other hand, when the shift register is driven in the reverse mode, the stages ST1 to STn output the scan pulses in order from the last stage STn to the first stage ST1. That is, the last stage STn outputs the nth scan pulse SPn, the (n−1)th stage then outputs the (n−1)th scan pulse, the (n−2)th stage then outputs the (n−2)th scan pulse, . . . , and the first stage ST1 finally outputs the first scan pulse SP1.

The scan pulses SP1 to SPn output from the stages ST1 to STn are sequentially supplied to n gate lines of a display device (for example, a liquid crystal display device, a light emitting diode display device, or the like) to sequentially scan the n gate lines. Also, the scan pulse output from each of the stages ST1 to STn is supplied only to an upstream stage, is supplied to the upstream stage and a downstream stage or is supplied only to the downstream stage. For example, a scan pulse output from an mth stage (where m is a natural number less than n) may be supplied to an mth gate line, an (m−p)th stage (where p is a natural number less than m) and an (m+q)th stage (where q is a natural number). Here, m is a natural number less than n, and the mth stage means any one of the n stages. FIG. 1 illustrates one example in which the scan pulse from the mth stage is supplied to an (m−1)th stage and an (m+1)th stage.

This shift register may be built in the display device. That is, the display device includes a display panel, which has a display region for displaying an image, and a non-display region surrounding the display region, and the shift register is built in the non-display region.

Each of the stages ST1 to STn of the shift register, configured in this manner, is supplied with an activation voltage VGL, a deactivation voltage VGH, and at least one of first to fourth clock pulses CLK1 to CLK4 which are output sequentially out of phase with one another and cyclically. On the other hand, the first stage ST1 and last stage STn among the stages ST1 to STn are further supplied with a start pulse Vst in addition to the above voltages and clock pulses.

FIG. 1 illustrates one example in which each of the stages ST1 to STn is supplied with the activation voltage VGL, the deactivation voltage VGH and three clock pulses with different phases. Here, each of the first stage ST1 and last stage STn among these stages ST1 to STn is further supplied with the start pulse Vst.

The activation voltage VGL is used to activate a set node Q and a reset node QB of each of the stages ST1 to STn, whereas the deactivation voltage VGH is used to deactivate the set node Q, reset node QB and output terminal OT of each of the stages ST1 to STn. Here, when any one node is activated, switching devices connected to this node through the gate electrodes thereof are turned on. Conversely, when any one node is deactivated, switching devices connected to this node through the gate electrodes thereof are turned off. The activation voltage VGL and the deactivation voltage VGH have opposite polarities. That is, according to the types of switching devices used, the activation voltage VGL may be positive and the deactivation voltage VGH may be negative, and, conversely, the activation voltage VGL may be negative and the deactivation voltage VGH may be positive. For example, in the case where switching devices used in each of the stages ST1 to STn are composed of N-type transistors, the activation voltage VGL is positive and the deactivation voltage VGH is negative. On the contrary, in the case where switching devices used in each of the stages ST1 to STn are composed of P-type transistors, the activation voltage VGL is negative and the deactivation voltage VGH is positive.

The activation voltage VGL and the deactivation voltage VGH are both direct current (DC) voltages, as shown in FIGS. 2A and 2B.

Each of the first to fourth clock pulses CLK1 to CLK4 is a pulse signal which periodically has an activation voltage and a deactivation voltage. A duration in which each of the first to fourth clock pulses CLK1 to CLK4 is kept at the activation voltage has a length of one horizontal period. This length of one horizontal period is a time for which one gate line is driven. When each clock pulse CLK1 to CLK4 is kept at the activation voltage, a switching device supplied with this is turned on. On the contrary, when each clock pulse CLK1 to CLK4 is kept at the deactivation voltage, a switching device supplied with this is turned off. Likewise, according to the types of switching devices used, the activation voltage of each clock pulse may be positive and the deactivation voltage of each clock pulse may be negative, and, conversely, the activation voltage may be negative and the deactivation voltage may be positive. For example, provided that the active state of each clock pulse CLK1 to CLK4 in FIGS. 2A and 2B is set to a low voltage which is negative, switching devices will be composed of P-type transistors.

When the shift register is driven in the forward mode, the first to fourth clock pulses CLK1 to CLK4 are sequentially and cyclically output and supplied to the shift register in the order of the fourth clock pulse CLK4, the first clock pulse CLK1, the second clock pulse CLK2 and the third clock pulse CLK3, as shown in FIG. 2A. On the contrary, when the shift register is driven in the reverse mode, the first to fourth clock pulses CLK1 to CLK4 are sequentially and cyclically output and supplied to the shift register in the order of the first clock pulse CLK1, the fourth clock pulse CLK4, the third clock pulse CLK3 and the second clock pulse CLK2, as shown in FIG. 2B. One of clock pulses output in adjacent periods is output after being delayed from the other clock pulse by a length of one clock pulse, i.e. one horizontal period. For example, in FIG. 2A, the first clock pulse CLK1 is output later than the fourth clock pulse CLK4. In detail, the first clock pulse CLK1 is output after being delayed from the fourth clock pulse CLK4 by a time corresponding to the length of one horizontal period.

Although the four types of clock pulses having different phases are used for illustrative purposes in the present invention, any number of types of clock pulses may be used as long as they are two or more.

On the other hand, the first to fourth clock pulses CLK1 to CLK4 may be output in such a manner that they overlap with each other. That is, the active durations of the fourth clock pulse CLK4 and first clock pulse CLK1 output adjacent to each other may partially overlap with each other.

As shown in FIG. 1, each of the stages ST1 to STn receives three clock pulses having different phases among the first to fourth clock pulses CLK1 to CLK4 and outputs any one of the received clock pulses as a scan pulse. For example, a (4 m+1)th stage may output a scan pulse using the first clock pulse CLK1, a (4 m+2)th stage may output a scan pulse using the second clock pulse CLK2, a (4 m+3)th stage may output a scan pulse using the third clock pulse CLK3, and a (4 m+4)th stage may output a scan pulse using the fourth clock pulse CLK4.

Also, each stage ST1 to STn controls the voltage states of the set node Q and reset node QB thereof using the other two of the above three clock pulses. For example, the (4 m+1)th stage controls the voltage states of the set node Q and reset node QB thereof using the fourth and third clock pulses CLK4 and CLK3, the (4 m+2)th stage controls the voltage states of the set node Q and reset node QB thereof using the first and fourth clock pulses CLK1 and CLK4, the (4 m+3)th stage controls the voltage states of the set node Q and reset node QB thereof using the second and first clock pulses CLK2 and CLK1, and the (4 m+4)th stage controls the voltage states of the set node Q and reset node QB thereof using the third and second clock pulses CLK3 and CLK2.

As shown in FIG. 1, the mth stage is set in response to the scan pulse from the (m−1)th stage. Exceptionally, because there is no stage upstream from the first stage ST1, the first stage ST1 is set in response to the start pulse Vst from a timing controller (not shown). At this time, the start pulse Vst from the timing controller is also supplied to the last stage STn to reset the last stage STn.

Hereinafter, a circuit configuration of each stage ST1 to STn will be described in detail.

Figure 3:
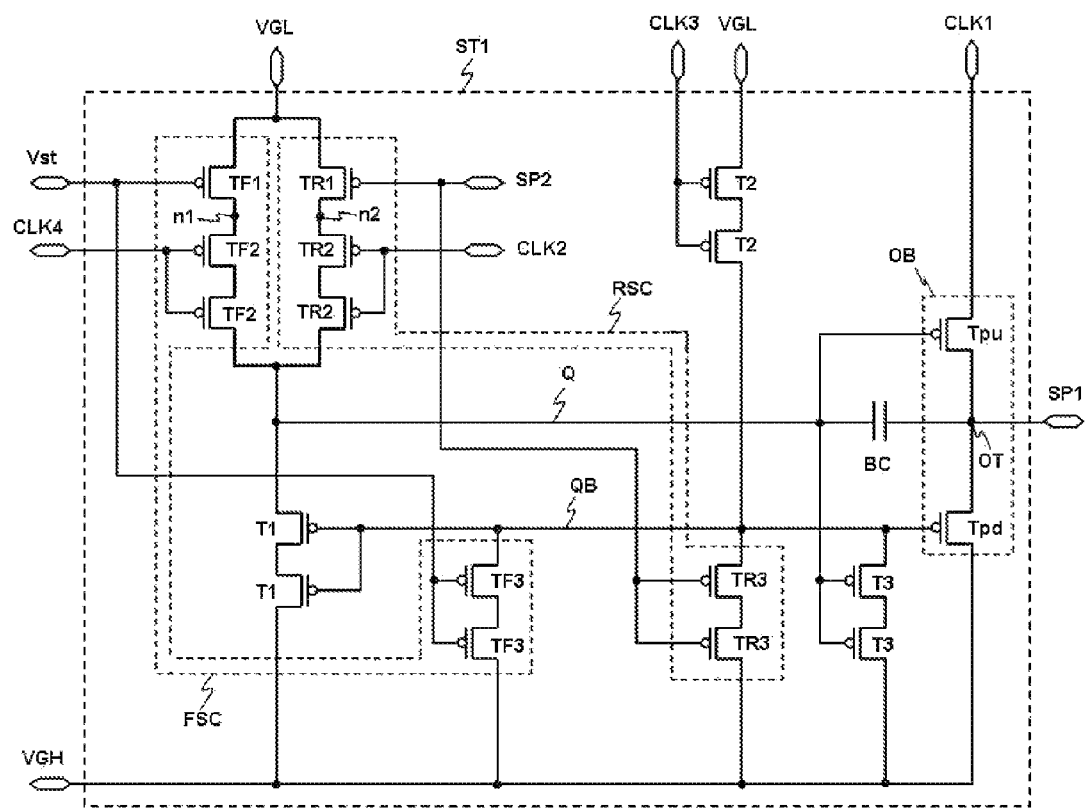
FIG. 3 is a circuit diagram of a first stage in FIG. 1.

FIG. 3 is a circuit diagram of the first stage ST1 in FIG. 1.

The first stage ST1 includes a forward scan controller FSC, a reverse scan controller RSC, and an output unit OB, as shown in FIG. 3. Besides, the first stage ST1 may further include two first switching devices T1 connected in series, two second switching devices T2 connected in series, two third switching devices T3 connected in series, and a boosting capacitor BC.

The forward scan controller FSC makes the set node Q active and the reset node QB inactive based on any one of the clock pulses CLK1 to CLK4 and start pulse Vst. To this end, the forward scan controller FSC of the first stage ST1 includes a first forward switching device TF1, two second forward switching devices TF2 connected in series, and two third forward switching devices TF3 connected in series.

The first forward switching device TF1 is controlled by the start pulse Vst supplied thereto and is connected between an activation transfer line which transfers the activation voltage VGL and a first node n1.

The second forward switching devices TF2 are controlled by any one of the clock pulses CLK1 to CLK4 supplied thereto and are connected in series between the first node n1 and the set node Q. For example, the second forward switching devices TF2 of the first stage ST1 interconnect the first node n1 and the set node Q in response to the fourth clock pulse CLK4.

The third forward switching devices TF3 are controlled by the start pulse Vst and are connected in series between the reset node QB and a deactivation transfer line. Here, the deactivation transfer line transfers the above-stated deactivation voltage VGH.

Here, when the shift register is driven in the forward mode, the start pulse Vst supplied to the first forward switching device TF1 and the fourth clock pulse CLK4 supplied to the second forward switching devices TF2 are in synchronization with each other. As a result, the first to third forward switching devices TF1 to TF3 are all simultaneously turned on in the same period. However, when the shift register is driven in the reverse mode, the start pulse Vst supplied to the first forward switching device TF1 and the fourth clock pulse CLK4 supplied to the second forward switching devices TF2 are not in synchronization with each other.

The reverse scan controller RSC makes the set node Q active and the reset node QB inactive based on any one of the clock pulses CLK1 to CLK4 and a scan pulse from a downstream stage. To this end, the reverse scan controller RSC of the first stage ST1 includes a first reverse switching device TR1, two second reverse switching devices TR2 connected in series, and two third reverse switching devices TR3 connected in series.

The first reverse switching device TR1 is controlled by the scan pulse from the downstream stage supplied thereto and is connected between the activation transfer line and a second node n2. For example, the first reverse switching device TR1 of the first stage ST1 interconnects the activation transfer line and the second node n2 in response to the second scan pulse SP2 from the second stage ST2. Here, the activation transfer line transfers the above-stated activation voltage VGL.

The second reverse switching devices TR2 are controlled by any one of the clock pulses CLK1 to CLK4 supplied thereto and are connected in series between the second node n2 and the set node Q. For example, the second reverse switching devices TR2 of the first stage ST1 interconnect the second node n2 and the set node Q in response to the second clock pulse CLK2.

The third reverse switching devices TR3 are controlled by the scan pulse from the downstream stage and are connected in series between the reset node QB and the deactivation transfer line. For example, the third reverse switching devices TR3 of the first stage ST1 interconnect the reset node QB and the deactivation transfer line in response to the second scan pulse SP2 from the second stage ST2.

Here, the second scan pulse SP2 supplied to the first reverse switching device TR1 and the second clock pulse CLK2 supplied to the second reverse switching devices TR2 are in synchronization with each other. As a result, the first to third reverse switching devices TR1 to TR3 are all simultaneously turned on in the same period.

The first switching devices T1 are controlled by a voltage at the reset node QB and are connected in series between the set node Q and the deactivation transfer line.

The second switching devices T2 are controlled by any one of the clock pulses CLK1 to CLK4 and are connected in series between the activation transfer line and the reset node QB. For example, the second switching devices T2 of the first stage ST1 interconnect the activation transfer line and the reset node QB in response to the third clock pulse CLK3.

The third switching devices T3 are controlled by a voltage at the set node Q and are connected in series between the reset node QB and the deactivation transfer line.

The output unit OB outputs any one of a corresponding scan pulse and the deactivation voltage VGH based on the voltages at the set node Q and reset node QB. To this end, the output unit OB of the first stage ST1 includes a pull-up switching device Tpu and a pull-down switching device Tpd.

The pull-up switching device Tpu is controlled by the voltage at the set node Q and is connected between a clock transfer line which transfers any one of the clock pulses CLK1 to CLK4 and the output terminal OT of the first stage ST1. For example, the pull-up switching device Tpu of the first stage ST1 outputs the first clock pulse CLK1 as the first scan pulse SP1 in response to the voltage at the set node Q. This first scan pulse SP1 is output through the output terminal OT of the first stage ST1.

The pull-down switching device Tpd is controlled by the voltage at the reset node QB and is connected between the output terminal OT and the deactivation transfer line.

Figure 4:
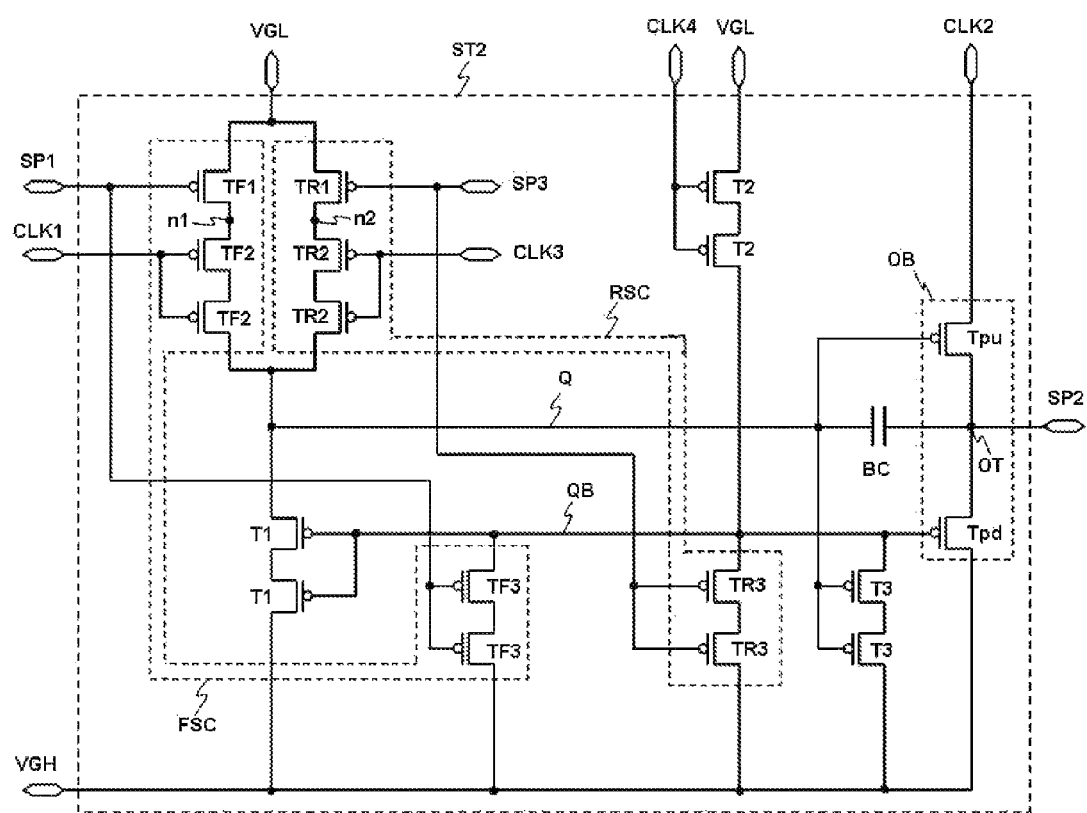
FIG. 4 is a circuit diagram of a second stage in FIG. 1.

FIG. 4 is a circuit diagram of the second stage ST2 in FIG. 1.

The second stage ST2 includes, as shown in FIG. 4, a forward scan controller FSC, a reverse scan controller RSC, and an output unit OB, too. Besides, the second stage ST2 may further include two first switching devices T1 connected in series, two second switching devices T2 connected in series, two third switching devices T3 connected in series, and a boosting capacitor BC.

The configuration of each of the second to (n−1)th stages is substantially the same as that of the first stage ST1 of FIG. 3, stated above. Exceptionally, the first forward switching device TF1 and third forward switching devices TF3 of each of the second to (n−1)th stages are supplied with a scan pulse from an upstream stage, not the start pulse Vst. For example, as shown in FIG. 4, the first forward switching device TF1 and third forward switching devices TF3 of the second stage are supplied with the first scan pulse SP1 from the first stage ST1. Also, three clock pulses supplied to each of the second to (n−1)th stages are supplied in a manner as shown in FIG. 1.

Figure 5:
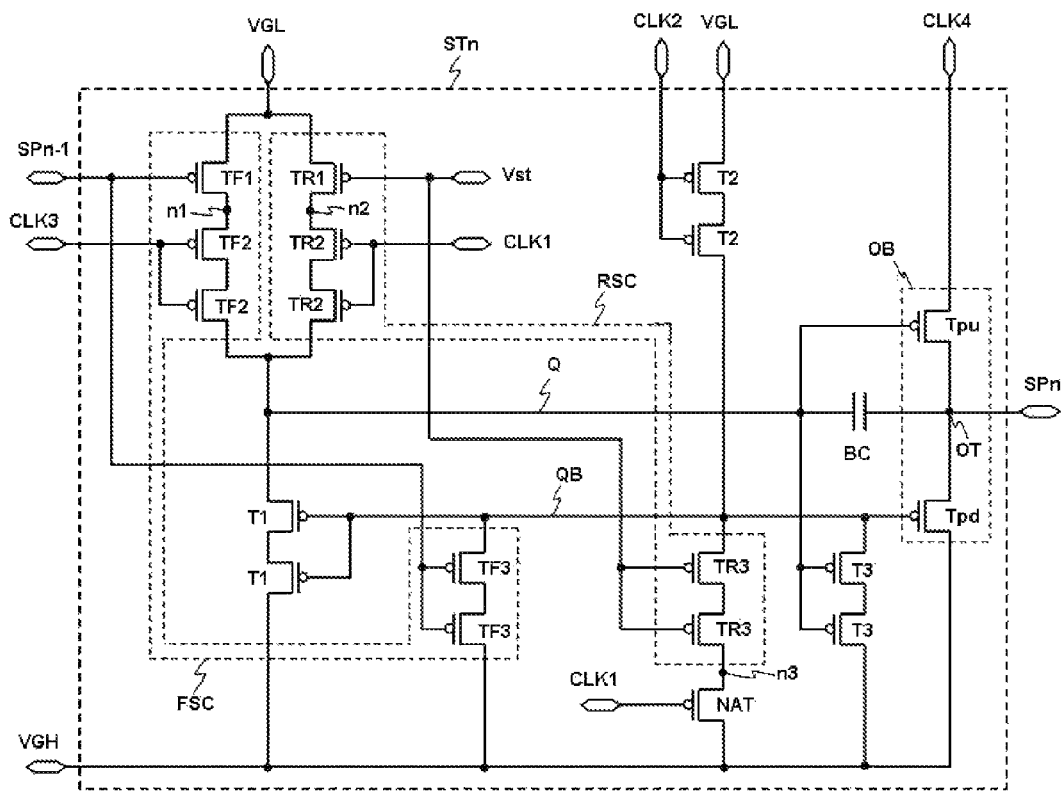
FIG. 5 is a circuit diagram of a last stage in FIG. 1.

FIG. 5 is a circuit diagram of the last stage STn in FIG. 1.

The last stage STn includes, as shown in FIG. 5, a forward scan controller FSC, a reverse scan controller RSC, and an output unit OB, too. Besides, the last stage STn may further include two first switching devices T1 connected in series, two second switching devices T2 connected in series, two third switching devices T3 connected in series, and a boosting capacitor BC.

The configuration of the last stage STn is substantially the same as that of the second stage ST2 of FIG. 4, stated above. Exceptionally, the first reverse switching device TR1 of the last stage STn is supplied with the start pulse Vst from the timing controller, not a scan pulse from a downstream stage. Also, when the shift register is driven in the forward mode, the start pulse Vst supplied to the first reverse switching device TR1 and the first clock pulse CLK1 supplied to the second reverse switching devices TR2 are not in synchronization with each other. Further, three clock pulses supplied to the last stage STn are supplied in a manner as shown in FIG. 1.

In particular, the third reverse switching devices TR3 of the last stage STn are connected between the reset node QB and a third node n3, and the last stage STn further includes a switching device NAT for deactivation prevention. The deactivation prevention switching device NAT is controlled by a clock pulse having a phase different from that of a clock pulse supplied to the output unit OB, and prevents the reset node QB from being deactivated at a time that the clock pulse supplied to the output unit OB is applied to the output unit OB. To this end, the deactivation prevention switching device NAT is controlled by any one of the clock pulses CLK1 to CLK4 and is connected between the third node n3 and the deactivation transfer line.

That is, the deactivation prevention switching device NAT is connected between the third reverse switching devices TR3 and the deactivation transfer line, as shown in FIG. 5, so as to, when the third reverse switching devices TR3 are turned on by the start pulse Vst, prevent the deactivation voltage VGH from being applied to the reset node QB by the turned-on thiFrd reverse switching devices TR3, thereby preventing the set node Q of the last stage STn from being kept floating in an initial period P0 of every frame when the shift register is driven in the forward mode. Provided that the deactivation prevention switching device NAT does not exist, the third reverse switching devices TR3 of the last stage STn are turned on by the start pulse Vst, so that the reset node QB is kept at the deactivation voltage VGH, thereby causing the first switching devices T1 and the pull-down switching device Tpd, connected to the deactivated reset node QB through the gate electrodes thereof, to be turned off. As a result, the set node Q of the last stage STn floats. That is, because only the start pulse Vst and the fourth clock pulse CLK4 synchronized therewith are kept at the activation voltage VGL in the initial period P0 when the shift register is driven in the forward mode, the first to third forward switching devices TF1 to TF3, the second reverse switching devices TR2 and the pull-up switching device Tpu, connected to the set node Q through the source electrodes (or drain electrodes) thereof, are kept off. At this time, if the third reverse switching devices TR3 are turned on, even the first switching devices T1 and the pull-down switching device Tpd, connected to the set node Q through the source electrodes (or drain electrodes) thereof, are turned off. As a result, the set node Q of the last stage STn floats. In addition, in this initial period P0, if the fourth clock pulse CLK4 is supplied to the pull-up switching device Tpu provided in the output unit OB of the last stage STn, the voltage at the floating set node Q may be activated, namely, fall by a coupling phenomenon by a parasitic capacitor of the pull-up switching device Tpu. As the fourth clock pulse CLK4 periodically has the activation voltage VGL, the voltage at the set node Q may gradually fall to such a voltage as to turn on the pull-up switching device Tpu, thereby causing the pull-up switching device Tpu to be turned on. Accordingly, in spite of the fact that the current period is not an output period of the last stage STn, an output, or scan pulse, from this last stage STn may be generated. In other words, a plurality of scan pulses per one frame may be output from the last stage STn, which may be problematic. As a result, a last gate line connected to the output terminal OT of the last stage STn may be periodically driven, thereby causing pixels connected to the gate line to emit light with higher luminance than other pixels. In particular, when data corresponding to black is supplied to all pixels with light emitting elements, an end line brightening phenomenon may occur in which pixels connected to an end line (nth gate line) become brighter than pixels connected to other gate lines. This phenomenon may be more prominent at a high temperature at which the threshold voltage of the pull-up switching device Tpu is liable to be shifted.

Therefore, in the present invention, the above problem is avoided by preventing connection of the third reverse switching devices TR3 to the deactivation transfer line in the initial period P0 through the deactivation prevention switching device NAT provided in the last stage STn. That is, the deactivation prevention switching device NAT is turned on by another clock pulse which is not synchronized with the fourth clock pulse CLK4 supplied to the output unit OB of the last stage STn. As a result, even though the third reverse switching devices TR3 are turned on in the initial period P0 in which the fourth clock pulse CLK4 is kept at the activation voltage VGL, the deactivation prevention switching device NAT is kept off, thereby preventing the set node Q of the last stage STn from floating. Provided that the set node Q does not float in this manner, the above coupling phenomenon does not occur, thereby making it possible to prevent a multi-output from the last stage STn. FIG. 5 illustrates one example in which the first clock pulse CLK1 is applied to the gate electrode of the deactivation prevention switching device NAT. As another example, the second clock pulse CLK2 or the third clock pulse CLK3 may be applied instead of the first clock pulse CLK1. However, when the shift register is driven in the reverse mode, it is preferable that a clock pulse which is synchronized with the start pulse Vst in the reverse driving be applied to the gate electrode of the deactivation prevention switching device NAT in order to deactivate the reset node QB of the last stage STn. That is, because the start pulse Vst and the first clock pulse CLK1 are in synchronization with each other in the reverse driving as shown in FIG. 2B, it is preferable to apply the first clock pulse CLK1 to the gate electrode of the deactivation prevention switching device NAT.

On the other hand, the first stage ST1 among the stages according to the first embodiment of the present invention may further include the above-stated deactivation prevention switching device NAT, too.

Figure 6:
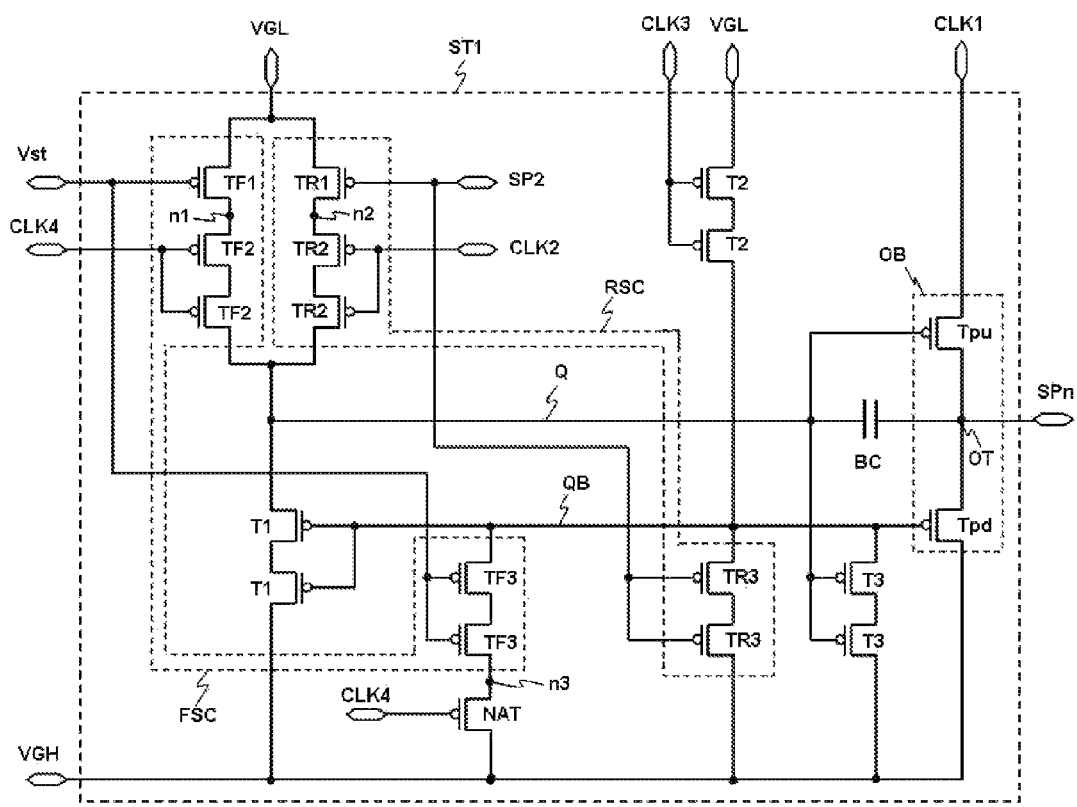
FIG. 6 is a circuit diagram showing a configuration of the first stage including a switching device for deactivation prevention.

FIG. 6 is a circuit diagram showing a configuration of the first stage ST1 including a switching device for deactivation prevention.

As shown in FIG. 6, the third forward switching devices TF3 of the first stage ST1 are connected between the reset node QB and a third node n3, and the first stage ST1 further includes a switching device NAT for deactivation prevention. The deactivation prevention switching device NAT is controlled by a clock pulse having a phase different from that of a clock pulse supplied to the output unit OB, and prevents the reset node QB from being deactivated at a time that the clock pulse supplied to the output unit OB is applied to the output unit OB. To this end, the deactivation prevention switching device NAT is controlled by any one of the clock pulses CLK1 to CLK4 and is connected between the third node n3 and the deactivation transfer line.

Therefore, in the present invention, the above problem is avoided by preventing connection of the third forward switching devices TF3 to the deactivation transfer line in the initial period P0 when the shift register is driven in the reverse mode, through the deactivation prevention switching device NAT provided in the first stage ST1. That is, the deactivation prevention switching device NAT is turned on by another clock pulse which is not synchronized with the first clock pulse CLK1 supplied to the output unit OB of the first stage ST1. As a result, even though the third forward switching devices TF3 are turned on in the initial period P0 in which the first clock pulse CLK1 is kept at the activation voltage VGL, the deactivation prevention switching device NAT is kept off, thereby preventing the set node Q of the first stage ST1 from floating. Provided that the set node Q does not float in this manner, the above coupling phenomenon does not occur, thereby making it possible to prevent a multi-output from the first stage ST1. FIG. 6 illustrates one example in which the fourth clock pulse CLK4 is applied to the gate electrode of the deactivation prevention switching device NAT. As another example, the second clock pulse CLK2 or the third clock pulse CLK3 may be applied instead of the fourth clock pulse CLK4. However, when the shift register is driven in the forward mode, it is preferable that a clock pulse which is synchronized with the start pulse Vst in the forward driving be applied to the gate electrode of the deactivation prevention switching device NAT in order to deactivate the reset node QB of the first stage ST1. That is, because the start pulse Vst and the fourth clock pulse CLK4 are in synchronization with each other in the forward driving as shown in FIG. 2A, it is preferable to apply the fourth clock pulse CLK4 to the gate electrode of the deactivation prevention switching device NAT.

The operations of the stages according to the first embodiment of the present invention, configured in this manner, will hereinafter be described with reference to FIG. 2A and FIGS. 3 to 5. First, a description will be given of operations of the stages when the shift register is driven in the forward mode.

Initial Period P0

First, an operation of the first stage ST1 in the initial period P0 will be described with reference to FIGS. 2A and 3.

In the initial period P0, the start pulse Vst and the fourth clock pulse CLK4 are kept at the activation voltage VGL, as shown in FIG. 2A.

The start pulse Vst is supplied to the gate electrode of the first forward switching device TF1 of the first stage ST1 and each of the gate electrodes of the third forward switching devices TF3 of the first stage ST1. Also, the fourth clock pulse CLK4 is supplied to each of the gate electrodes of the second forward switching devices TF2 of the first stage ST1.

Accordingly, the first to third forward switching devices TF1 to TF3 are turned on. Then, the activation voltage VGL is supplied to the set node Q through the turned-on first and second forward switching devices TF1 and TF2. As a result, the pull-up switching device Tpu and the third switching devices T3, connected to the activated set node Q through the gate electrodes thereof, are turned on.

Also, the deactivation voltage VGH is supplied to the reset node QB through the turned-on third forward switching devices TF3 and third switching devices T3. As a result, the pull-down switching device Tpd and the first switching devices T1, connected to the deactivated reset node QB through the gate electrodes thereof, are turned off. On the other hand, an operation of the last stage STn in the initial period P0 will be described with reference to FIGS. 2A and 5.

In the initial period P0, the start pulse Vst and the fourth clock pulse CLK4 are kept at the activation voltage VGL, as shown in FIG. 2A.

The start pulse Vst is supplied to the gate electrode of the first reverse switching device TR1 of the last stage STn and each of the gate electrodes of the third reverse switching devices TR3 of the last stage STn. Also, the fourth clock pulse CLK4 is supplied to the source electrode (or drain electrode) of the pull-up switching device Tpu of the last stage STn.

Accordingly, the first and third reverse switching devices TR1 and TR3 are turned on. However, the first clock pulse CLK1 which is kept at the deactivation voltage VGH in this initial period P0 is supplied to the gate electrode of the deactivation prevention switching device NAT, so that the deactivation prevention switching device NAT is kept off. Thus, in spite of the fact that the third reverse switching devices TR3 are turned on, the reset node QB of the last stage STn is kept at the activation voltage VGL by the deactivation prevention switching device NAT which stays off. As a result, the pull-down switching device Tpd and the first switching devices T1, connected to the activated reset node QB through the gate electrodes thereof, are kept on. Also, because the first switching devices T1 stay on, the set node Q and the deactivation transfer line are interconnected through the turned-on first switching devices T1. Therefore, the set node Q of the last stage STn is prevented from floating.

On the other hand, in the case where the first stage ST1 further includes the deactivation prevention switching device NAT as shown in FIG. 6, the above fourth clock pulse CLK4 is also supplied to the gate electrode of the deactivation prevention switching device NAT of the first stage ST1. As a result, in this initial period P0, the deactivation prevention switching device NAT is turned on, so that the reset node QB of the first stage ST1 can be normally deactivated.

First Period P1

Next, an operation of the first stage ST1 in a first period P1 will be described with reference to FIGS. 2A and 3.

In the first period P1, the first clock pulse CLK1 is kept at the activation voltage VGL, as shown in FIG. 2A. On the other hand, in this first period P1, the start pulse Vst and the fourth clock pulse CLK4 are kept at the deactivation voltage VGH, thereby causing the switching devices of the first stage ST1 supplied with them to be turned off. As a result, in this first period P1, the set node Q of the first stage ST1 is kept floating.

This first clock pulse CLK1 is supplied to the source electrode (or drain electrode) of the pull-up switching device Tpu of the first stage ST1. Accordingly, the voltage at the floating set node Q is amplified by the boosting capacitor BC and a bootstrapping phenomenon. Then, the pull-up switching device Tpu, connected to the set node Q, outputs the first clock pulse CLK1 as the first scan pulse SP1. This first scan pulse SP1 is supplied to a first gate line and the second stage ST2 through the output terminal OT of the first stage ST1. That is, as shown in FIG. 4, the first scan pulse SP1 is supplied to the first forward switching device TF1 and the third forward switching devices TF3 provided in the second stage ST2. As a result, an operation of the second stage ST2 in this first period P1 is performed in the same manner as the operation of the first stage ST1 in the initial period P0.

Second Period P2

Next, an operation of the first stage ST1 in a second period P2 will be described with reference to FIGS. 2A and 3.

In the second period P2, the second clock pulse CLK2 is kept at the activation voltage VGL, as shown in FIG. 2A. Also, an operation of the second stage ST2 supplied with the second clock pulse CLK2 is performed in the same manner as the operation of the first stage ST1 in the first period P1. As a result, in this second period P2, the second scan pulse SP2 output from the second stage ST2 is also kept at the activation voltage VGL.

The second clock pulse CLK2 and the second scan pulse SP2 are supplied to the first stage ST1. In detail, the second clock pulse CLK2 is supplied to each of the gate electrodes of the second reverse switching devices TR2, and the second scan pulse SP2 is supplied to the gate electrode of the first reverse switching device TR1 and each of the gate electrodes of the third reverse switching devices TR3.

Accordingly, the first to third reverse switching devices TR1 to TR3 are turned on. Then, the activation voltage VGL is supplied to the set node Q through the turned-on first and second reverse switching devices TR1 and TR2. As a result, the pull-up switching device Tpu and the third switching devices T3, connected to the activated set node Q through the gate electrodes thereof, are turned on.

Also, the deactivation voltage VGH is supplied to the reset node QB through the turned-on third reverse switching devices TR3 and third switching devices T3. As a result, the pull-down switching device Tpd and the first switching devices T1, connected to the deactivated reset node QB through the gate electrodes thereof, are turned off. That is, in the second period P2, the first stage ST1 repeats the above-stated operation in the initial period P0 once again.

Third Period P3

Next, an operation of the first stage ST1 in a third period P3 will be described with reference to FIGS. 2A and 3.

In the third period P3, the third clock pulse CLK3 is kept at the activation voltage VGL, as shown in FIG. 2A. Also, an operation of the third stage ST3 supplied with the third clock pulse CLK3 is performed in the same manner as the above-stated operation of the first stage ST1 in the first period P1. As a result, in this third period P3, the third scan pulse SP3 output from the third stage ST3 is also kept at the activation voltage VGL.

The third clock pulse CLK3 is supplied to each of the gate electrodes of the second switching devices T2 provided in the first stage ST1. Accordingly, the second switching devices T2 are turned on and the activation voltage VGL is supplied to the reset node QB through the turned-on second switching devices T2. As a result, the pull-down switching device Tpd and the first switching devices T1, connected to the activated reset node QB through the gate electrodes thereof, are turned on.

Then, the deactivation voltage VGH is supplied to the set node Q through the turned-on first switching devices T1, so as to deactivate the set node Q. As a result, the pull-up switching device Tpu and the third switching devices T3, connected to the deactivated set node Q through the gate electrodes thereof, are turned off. On the other hand, the deactivation voltage VGH is output at the output terminal OT of the first stage ST1 through the turned-on pull-down switching device Tpd.

In this manner, all stages perform a set operation, an output operation and a reset operation while sequentially going through the initial period P0, the first period P1 and the third period P3. A corresponding scan pulse is output in the output operation of each stage ST1 to STn.

On the other hand, when the shift register is driven in the reverse mode, all stages are supplied with clock pulses as shown in FIG. 2B.

This reverse operation is performed in substantially the same manner as the above-stated forward operation, with the exception that the stages operate in the reverse order of the forward operation. Also, in the initial period P0 of the reverse operation, the deactivation prevention switching device NAT of the first stage ST1 operates to prevent a multi-output from the first stage ST1.

Figure 7:
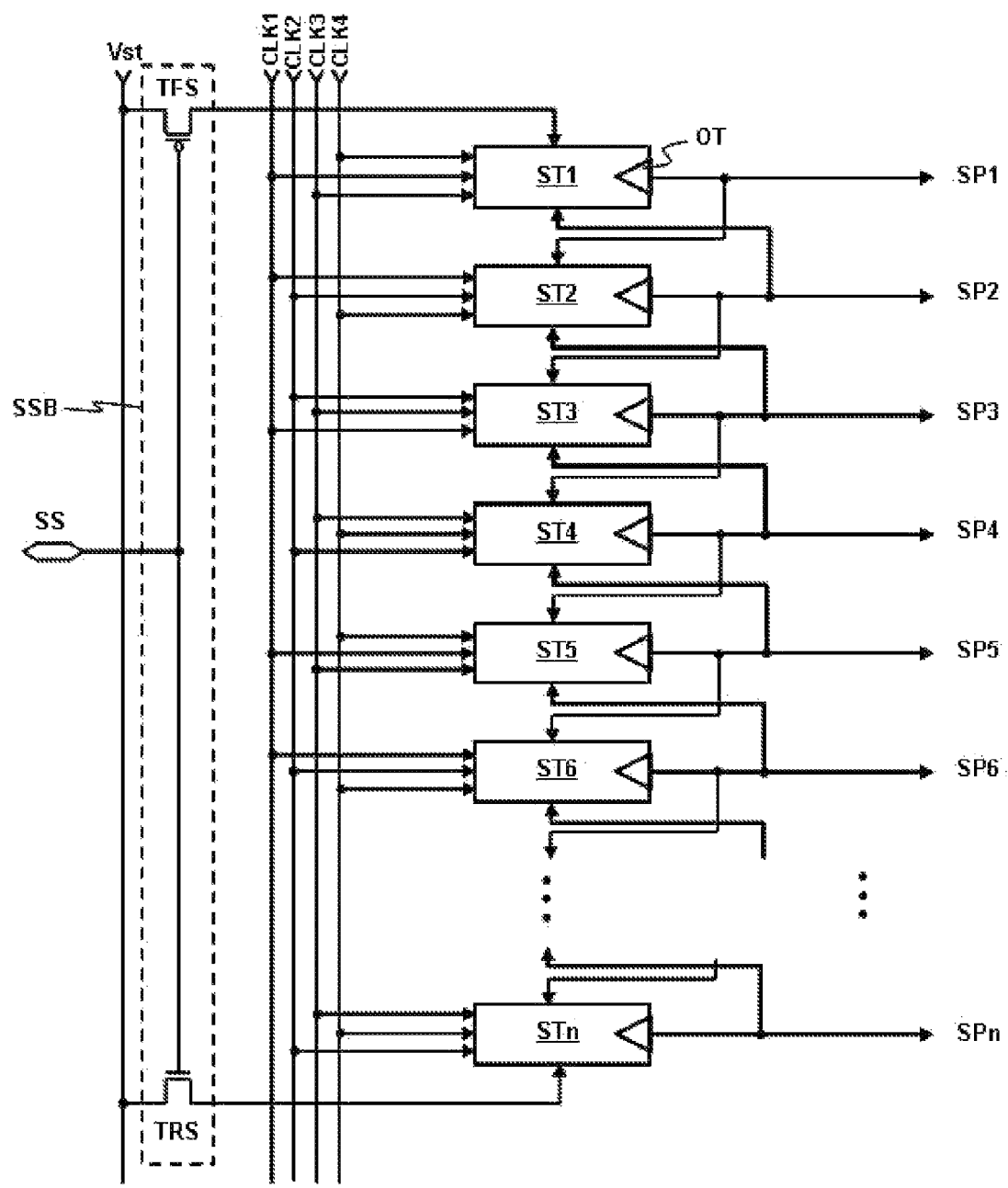
FIG. 7 is a block diagram showing the configuration of a bidirectional shift register according to a second embodiment of the present invention.

FIG. 7 is a block diagram showing the configuration of a bidirectional shift register according to a second embodiment of the present invention.

The bidirectional shift register according to the second embodiment of the present invention includes n stages ST1 to STn and a start selector SSB, as shown in FIG. 7.

Each of the stages ST1 to STn outputs one scan pulse SP1 to SPn for one frame period through an output terminal OT thereof.

Each of the stages ST1 to STn drives a gate line connected thereto using the scan pulse. Also, each of the stages ST1 to STn controls the operations of a stage downstream therefrom and a stage upstream therefrom using the scan pulse.

When the shift register is driven in a forward mode, the stages ST1 to STn output the scan pulses in order from the first stage ST1 to the last stage STn. That is, the first stage ST1 outputs the first scan pulse SP1, the second stage ST2 then outputs the second scan pulse SP2, the third stage ST3 then outputs the third scan pulse SP3, ..., and the last stage STn finally outputs the nth scan pulse SPn.

On the other hand, when the shift register is driven in a reverse mode, the stages ST1 to STn output the scan pulses in order from the last stage STn to the first stage ST1. That is, the last stage STn outputs the nth scan pulse SPn, the (n−1)th stage then outputs the (n−1)th scan pulse, the (n−2)th stage then outputs the (n−2)th scan pulse, ..., and the first stage ST1 finally outputs the first scan pulse SP1.

That is, the configurations of the stages provided in the shift register according to the second embodiment of the present invention are the same as those of the stages provided in the shift register of FIG. 1, described above.

On the other hand, the start selector SSB supplies the start pulse Vst to only the first stage ST1 in the forward mode where the shift register outputs the scan pulses forward, and to only the last stage STn in the reverse mode where the shift register outputs the scan pulses reversely.

Here, when the shift register is driven in the forward mode, the first stage ST1 outputs the corresponding scan pulse first of all, whereas, when the shift register is driven in the reverse mode, the last stage STn outputs the corresponding scan pulse first of all.

The start selector SSB includes a forward selection switching device TFS and a reverse selection switching device TRS.

The forward selection switching device TFS is controlled by a start selection signal SS and is connected between a start transfer line which transfers the start pulse Vst and the first stage ST1.

The reverse selection switching device TRS is controlled by the start selection signal SS and is connected between the start transfer line and the last stage STn.

Here, logic of the start selection signal SS when the shift register is driven in the forward mode and logic of the start selection signal SS when the shift register is driven in the reverse mode are opposite to each other. In this regard, the forward selection switching device TFS and the reverse selection switching device TRS are composed of transistors of opposite types. For example, the start selection signal SS may be kept at the activation voltage VGL or deactivation voltage VGH under external control.

In the case where the forward selection switching device TFS is a P-type transistor, whereas the reverse selection switching device TRS is an N-type transistor, as shown in FIG. 7, when the start selection signal SS is kept at the activation voltage VGL, the forward selection switching device TFS is turned on, whereas the reverse selection switching device TRS is turned off. Conversely, when the start selection signal SS is kept at the deactivation voltage VGH, the forward selection switching device TFS is turned off, whereas the reverse selection switching device TRS is turned on.

By doing so, the start pulse Vst can be selectively transferred to the first stage ST1 and the last stage STn. That is, when the shift register is driven in the forward mode, the start pulse Vst is supplied to the first stage ST1 and is not supplied to the last stage STn, whereas, when the shift register is driven in the reverse mode, the start pulse Vst is not supplied to the first stage ST1 and is supplied to the last stage STn. Therefore, according to the second embodiment of the present invention, it is possible to prevent multi-outputs from the first and last stages ST1 and STn without installing the deactivation prevention switching devices NAT in the first stage ST1 and last stage STn as in the above-described first embodiment.

Figure 8:
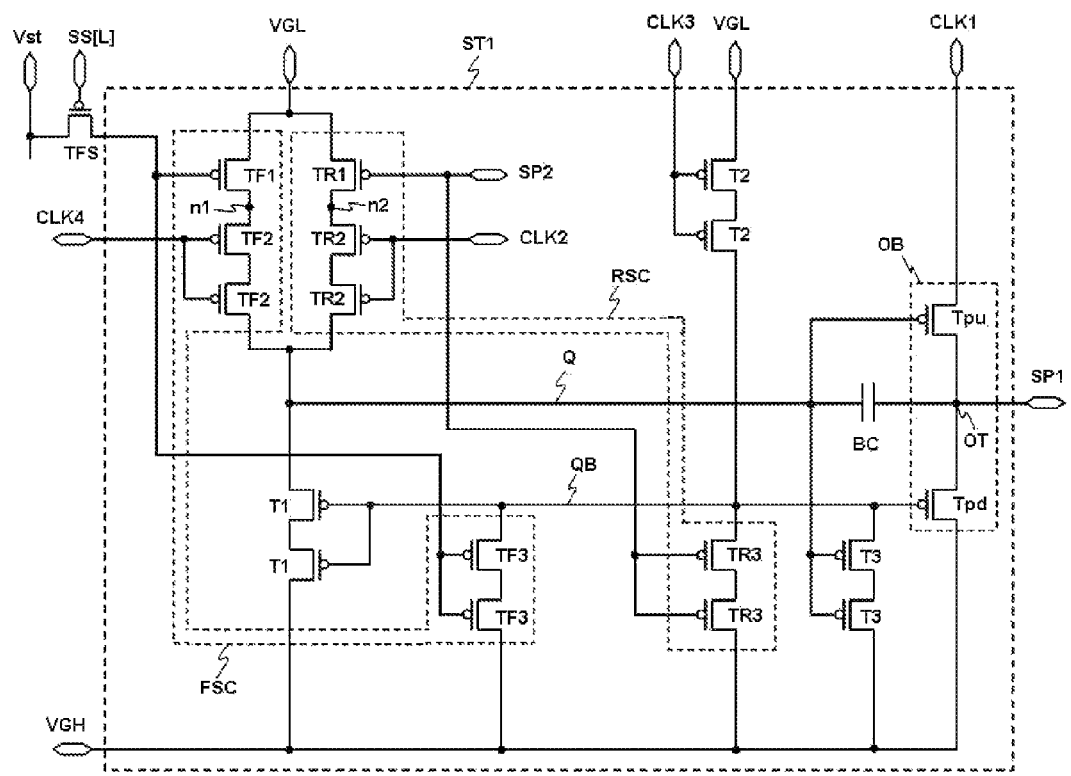
FIG. 8 is a circuit diagram of a first stage in FIG. 7.

FIG. 8 is a circuit diagram of the first stage ST1 in FIG. 7.

As shown in FIG. 8, the circuit configuration of the first stage ST1 is substantially the same as that of the first stage ST1 of the first embodiment, described above with reference to FIG. 3. Exceptionally, the first forward switching device TF1 and third forward switching devices TF3 of the first stage ST1 shown in FIG. 8 are supplied with the start pulse Vst switched by the forward selection switching device TFS. Of course, only when this forward selection switching device TFS is turned on by the start selection signal SS, the start pulse Vst is supplied to the above first forward switching device TF1 and third forward switching devices TF3. Here, the start selection signal SS may be synchronized in output timing with the start pulse Vst. In this case, the start selection signal SS may be kept at the activation voltage VGL for a longer time than the start pulse Vst. As a result, the start pulse Vst may be supplied to the first stage ST1 for a sufficient time. Alternatively, the start selection signal SS may be output slightly earlier than the start pulse Vst. In this case, the start selection signal SS may be kept at the activation voltage VGL for a longer time than the start pulse Vst.

Figure 9:
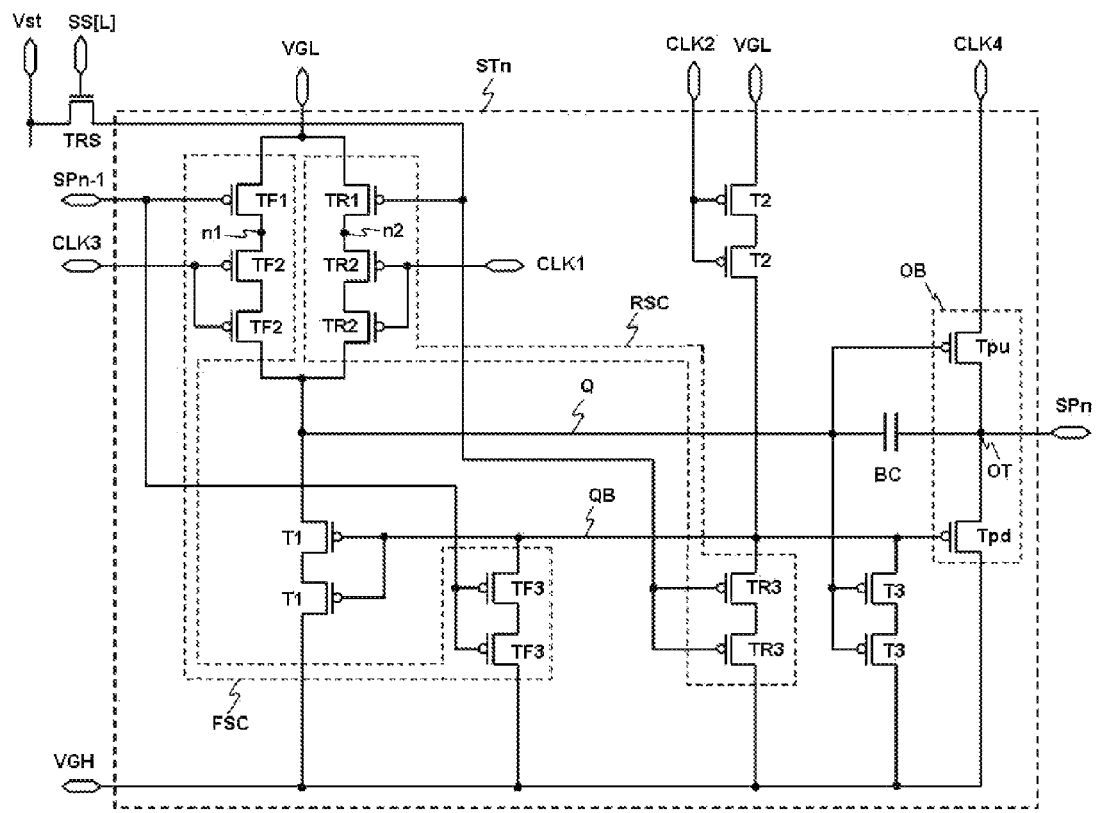
FIG. 9 is a circuit diagram of a last stage in FIG. 7.

FIG. 9 is a circuit diagram of the last stage STn in FIG. 7.

As shown in FIG. 9, the circuit configuration of the last stage STn is substantially the same as that of the last stage STn of the first embodiment, described above with reference to FIG. 5. Exceptionally, the last stage STn shown in FIG. 9 does not include the deactivation prevention switching device NAT. That is, as shown in FIG. 9, the third reverse switching devices TR3 are directly connected to the deactivation transfer line. Also, the first reverse switching device TR1 and third reverse switching devices TR3 of the last stage STn shown in FIG. 9 are supplied with the start pulse Vst switched by the reverse selection switching device TRS. Of course, only when this reverse selection switching device TRS is turned on by the start selection signal SS, the start pulse Vst is supplied to the above first reverse switching device TR1 and third reverse switching devices TR3. Here, the start selection signal SS may be synchronized in output timing with the start pulse Vst. In this case, the start selection signal SS may be kept at the deactivation voltage VGH for a longer time than the start pulse Vst. As a result, the start pulse Vst may be supplied to the last stage STn for a sufficient time. Alternatively, the start selection signal SS may be output slightly earlier than the start pulse Vst. In this case, the start selection signal SS may be kept at the deactivation voltage VGH for a longer time than the start pulse Vst.

As shown in FIGS. 8 and 9, when the shift register is driven in the forward mode, the start selection signal SS is kept at low logic, namely, the activation voltage VGL. At this time, the forward selection switching device TFS is turned on, whereas the reverse selection switching device TRS is turned off. Therefore, when the shift register is driven in the forward mode, the third reverse switching devices TR3 of the last stage STn are turned off, thereby preventing a multi-output from the last stage STn.

On the contrary, when the shift register is driven in the reverse mode, the start selection signal SS is kept at high logic, namely, the deactivation voltage VGH. At this time, the forward selection switching device TFS is turned off, whereas the reverse selection switching device TRS is turned on. Therefore, when the shift register is driven in the reverse mode, the third forward switching devices TF3 of the first stage ST1 are turned off, thereby preventing a multi-output from the first stage ST1.

On the other hand, in another embodiment, different selection signals may be supplied to the gate electrode of the forward selection switching device TFS and the gate electrode of the reverse selection switching device TRS, which will hereinafter be described in more detail with reference to FIG. 10.

Figure 10:
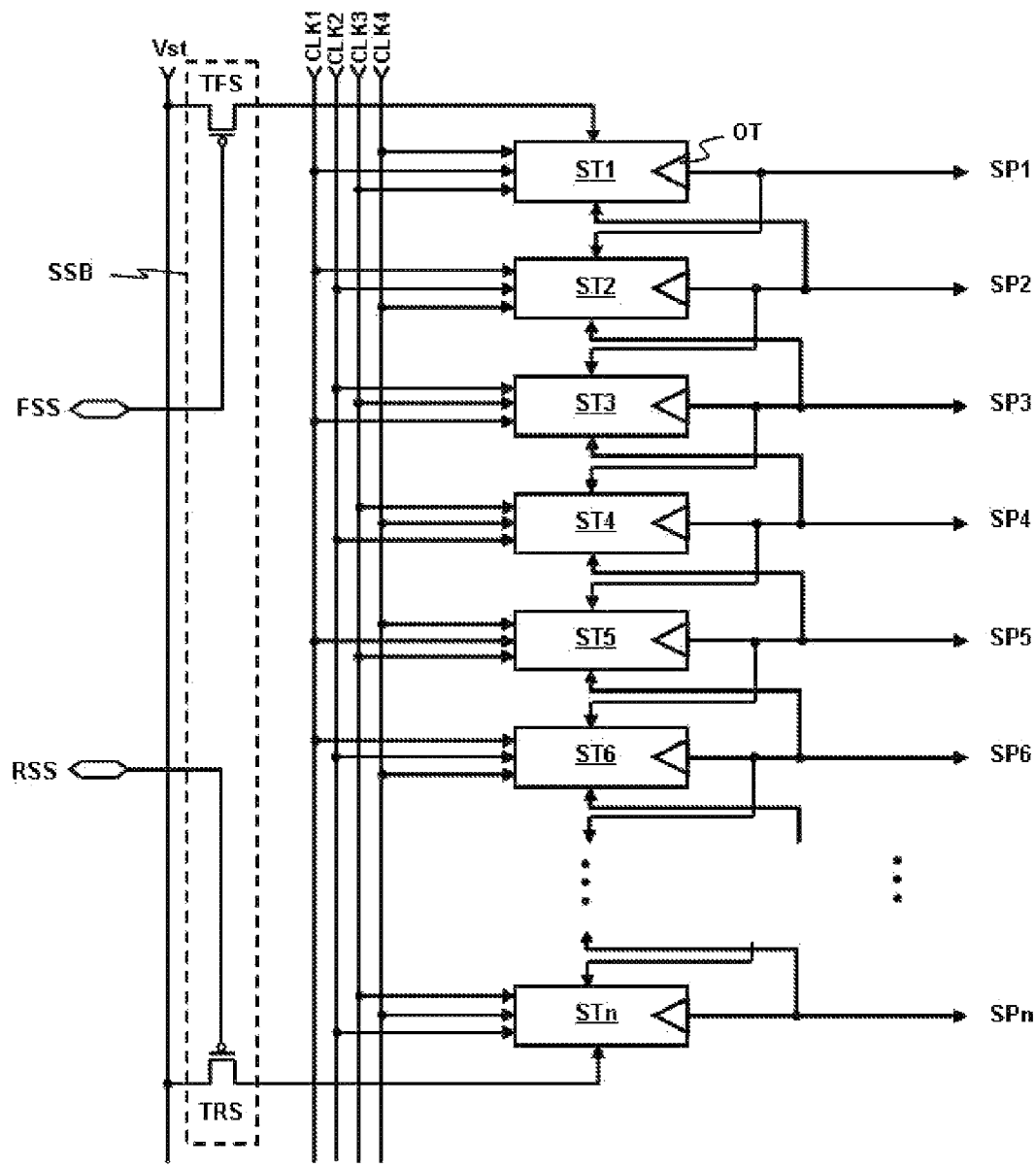
FIG. 10 is a block diagram showing the configuration of a bidirectional shift register according to a third embodiment of the present invention.

FIG. 10 is a block diagram showing the configuration of a bidirectional shift register according to a third embodiment of the present invention.

The bidirectional shift register according to the third embodiment of the present invention includes a plurality of stages ST1 to STn and a start selector SSB, as shown in FIG. 10. The stages ST1 to STn in the third embodiment are the same as the stages ST1 to STN in the second embodiment, stated above.

In the third embodiment, the start selector SSB includes a forward selection switching device TFS and a reverse selection switching device TRS which are composed of P-type transistors. As shown in FIG. 10, a forward selection signal FSS is applied to the gate electrode of the forward selection switching device TFS, whereas a reverse selection signal RSS is applied to the gate electrode of the reverse selection switching device TRS. The forward selection signal FSS is kept at the activation voltage VGL when the shift register is driven in the forward mode, and at the deactivation voltage VGH when the shift register is driven in the reverse mode. Conversely, the reverse selection signal RSS is kept at the deactivation voltage VGH when the shift register is driven in the forward mode, and at the activation voltage VGL when the shift register is driven in the reverse mode. In this manner, the forward selection signal FSS is an inverted version of the reverse selection signal RSS. As a result, in the forward driving, the forward selection signal FSS is made active and the reverse selection signal RSS is made inactive, so that the forward selection switching device TFS is turned on and the reverse selection switching device TRS is turned off. On the contrary, in the reverse driving, the forward selection signal FSS is made inactive and the reverse selection signal RSS is made active, so that the forward selection switching device TFS is turned off and the reverse selection switching device TRS is turned on.

Figure 11:
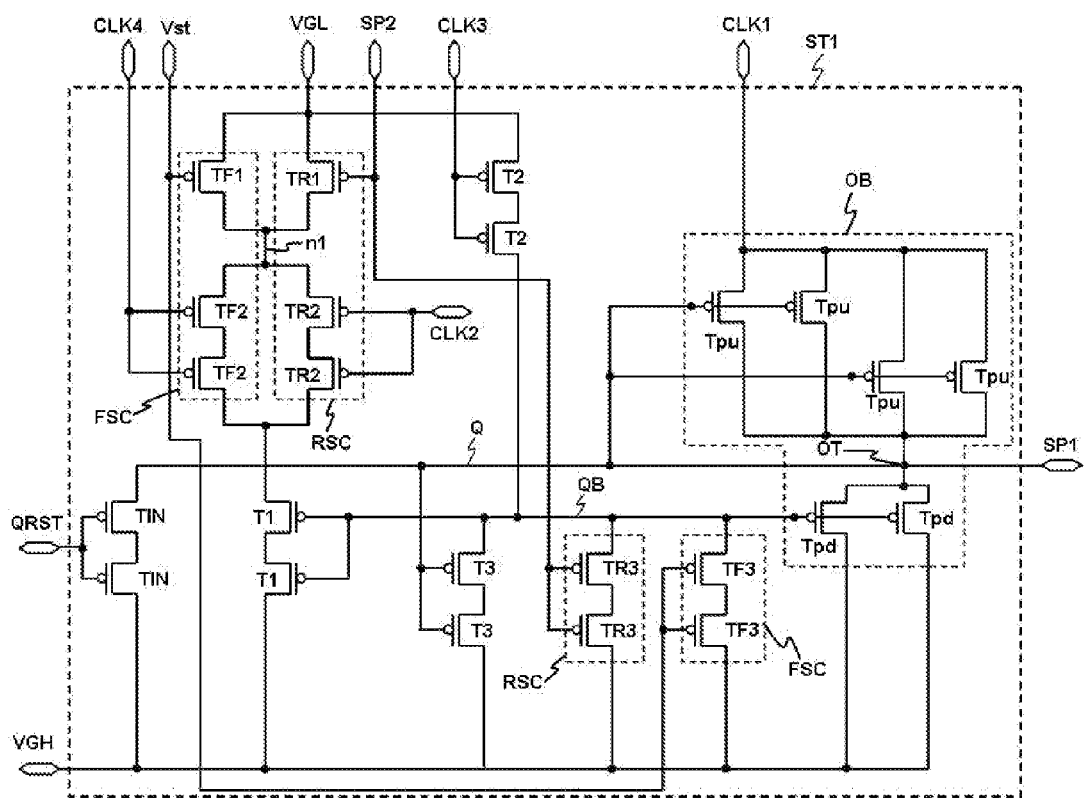
FIG. 11 is a circuit diagram showing another configuration of the first stage of the present invention.

FIG. 11 is a circuit diagram showing another configuration of the first stage ST1 of the present invention.

The circuit configuration of the first stage ST1 shown in FIG. 11 is substantially the same as that of the first stage ST1 shown in FIG. 3. Exceptionally, the first stage ST1 of FIG. 11 further includes two initialization switching devices TIN connected in series. These initialization switching devices TIN are turned on by an initialization signal QRST from the timing controller to transfer the deactivation voltage VGH to the set node Q. To this end, the initialization switching devices TIN are controlled by the initialization signal QRST and are connected between the set node Q and the deactivation transfer line. The initialization signal QRST is supplied to the initialization switching devices TIN only when the shift register is initially driven. This initialization signal QRST is kept at the activation voltage VGL before the start pulse Vst is applied. As a result, the initialization switching devices TIN are kept on for a period from application of power to the display device till output of the start pulse Vst.

Also, the pull-up switching device Tpu in the output unit OB of the first stage ST1 of FIG. 11 includes a plurality of pull-up switching devices. For example, the pull-up switching devices may be four in number and may be connected in parallel. Also, the pull-down switching device Tpd in the output unit OB of the first stage ST1 of FIG. 11 includes a plurality of pull-down switching devices. For example, the pull-down switching devices may be two in number and may be connected in parallel. That is, each of the pull-up switching device Tpu and pull-down switching device Tpd is set to be larger in area than each of the other switching devices to guarantee stable output of the scan pulse. In other words, the pull-up switching device Tpu or pull-down switching device Tpd can be increased in area by installing a plurality of pull-up switching devices or pull-down switching devices in parallel in the above manner.

Also, in FIG. 11, the first forward switching device TF1 and the second forward switching devices TF2 are connected in common to one first node n1. Also, the first reverse switching device TR1 and the second reverse switching devices TR2 are connected in common to the one first node n1, too.

The operation of the first stage ST1 shown in FIG. 11 is performed in substantially the same manner as that of the first stage ST1 of FIG. 3.

On the other hand, the circuit configuration of the stage shown in FIG. 11 is also applicable to the second to (n−1)th stages shown in FIG. 1. Exceptionally, each stage ST1 to STn is supplied with clock pulses in a manner as shown in FIG. 1.

On the other hand, a deactivation prevention switching device NAT may further be installed between the third forward switching devices TF3 and the deactivation transfer line in FIG. 11, as shown in FIG. 6.

Also, the configuration of the stage shown in FIG. 11 is applicable to the last stage STn shown in FIG. 1. In this case, a deactivation prevention switching device NAT must further be provided as stated above, which will hereinafter be described in detail with reference to FIG. 12.

Figure 12:
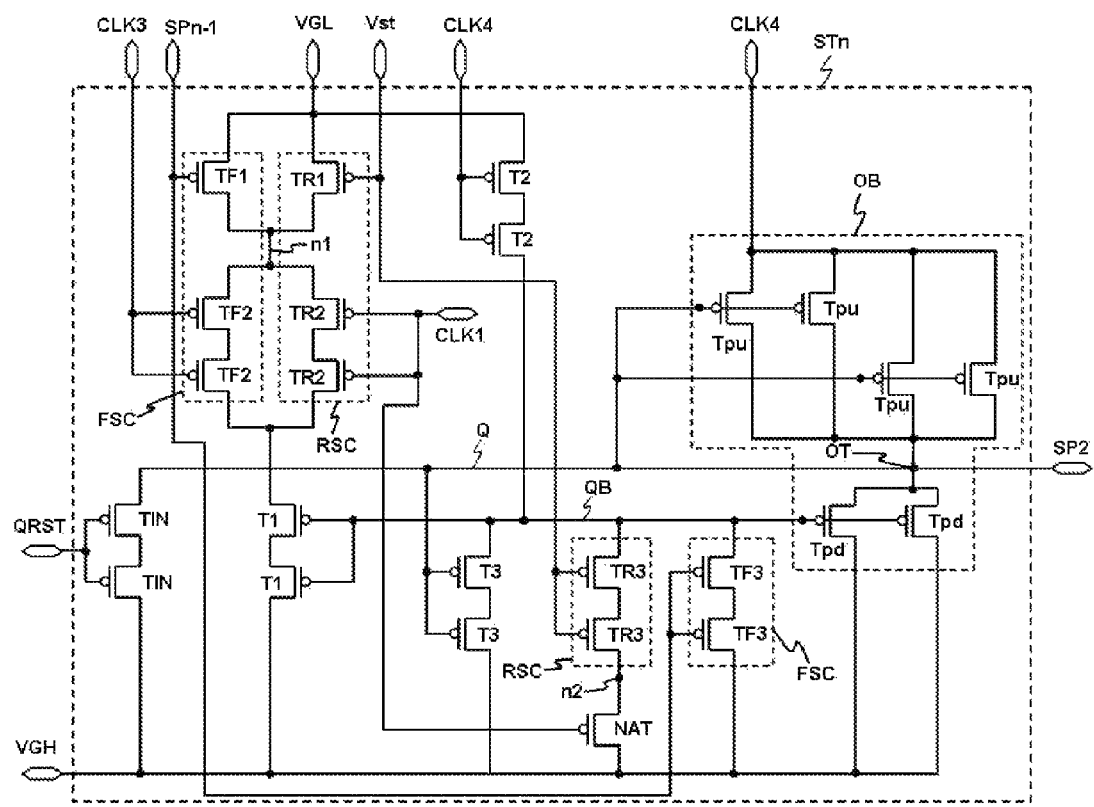
FIG. 12 is a circuit diagram showing another configuration of the last stage of the present invention.

FIG. 12 is a circuit diagram showing another configuration of the last stage STn of the present invention. As shown in this drawing, a switching device NAT for deactivation prevention is connected between the third reverse switching devices TR3 and the deactivation transfer line. The other configuration is the same as that shown in FIG. 11.

On the other hand, the circuit configuration of FIG. 11 may be applied to all stages ST1 to STn of the shift register according to each of the second and third embodiments of the present invention. In this case, the first stage ST1 and the last stage STn are connected with a forward selection switching device TFS and a reverse selection switching device TRS, respectively, as stated above.

On the other hand, the above-stated initialization switching devices TIN may be installed in each of all stages ST1 to STn including the first stage ST1, as well as in the first stage ST1. In this case, the initialization switching devices TIN of all stages ST1 to STn are simultaneously turned on for a period from application of power to the display device till output of the start pulse Vst.

On the other hand, the switching devices of the stages in the shift registers according to all embodiments may be composed of P-type transistors or N-type transistors. It will be understood that, when the switching devices are composed of N-type transistors, the above-stated activation voltage VGL, deactivation voltage VGH and clock pulses CLK1 to CLK4 are inverted in active state and inactive state so as to be suitable to operations of the switching devices.

Figure 13:
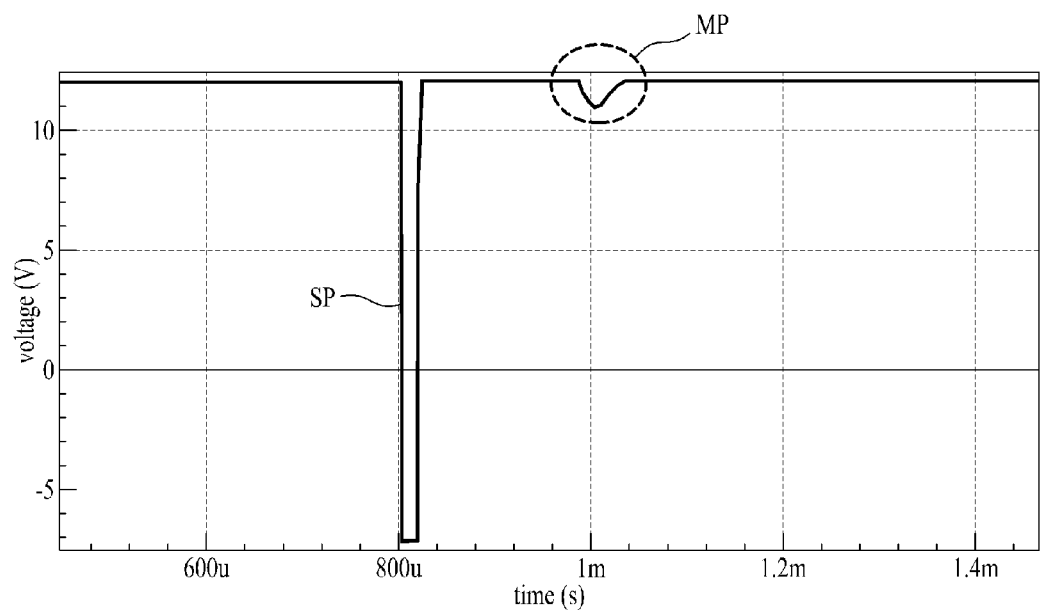
FIGS. 13 and 14 are views illustrating the effect of the present invention.
Figure 13:
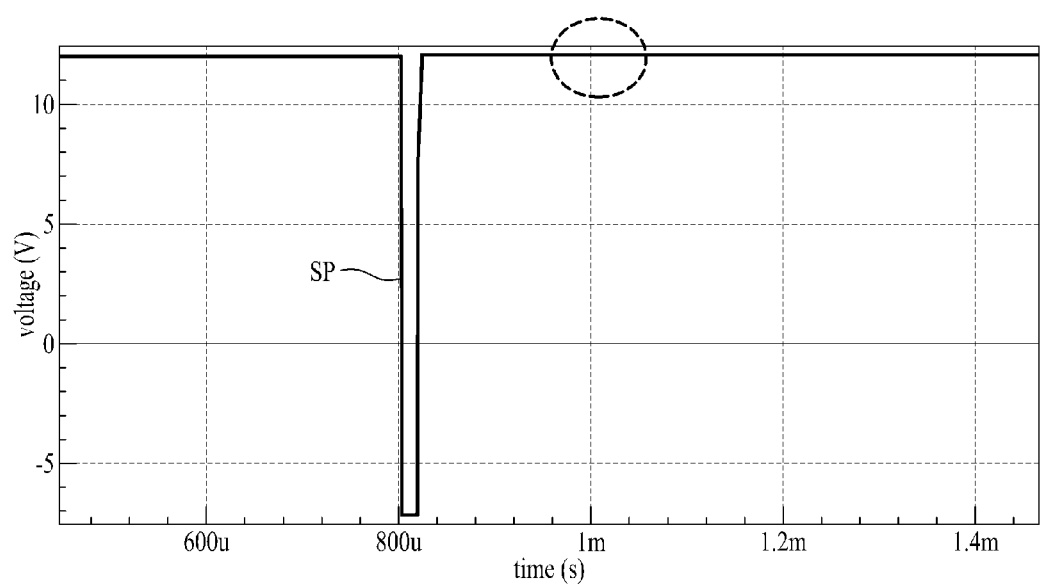
Figure 14:
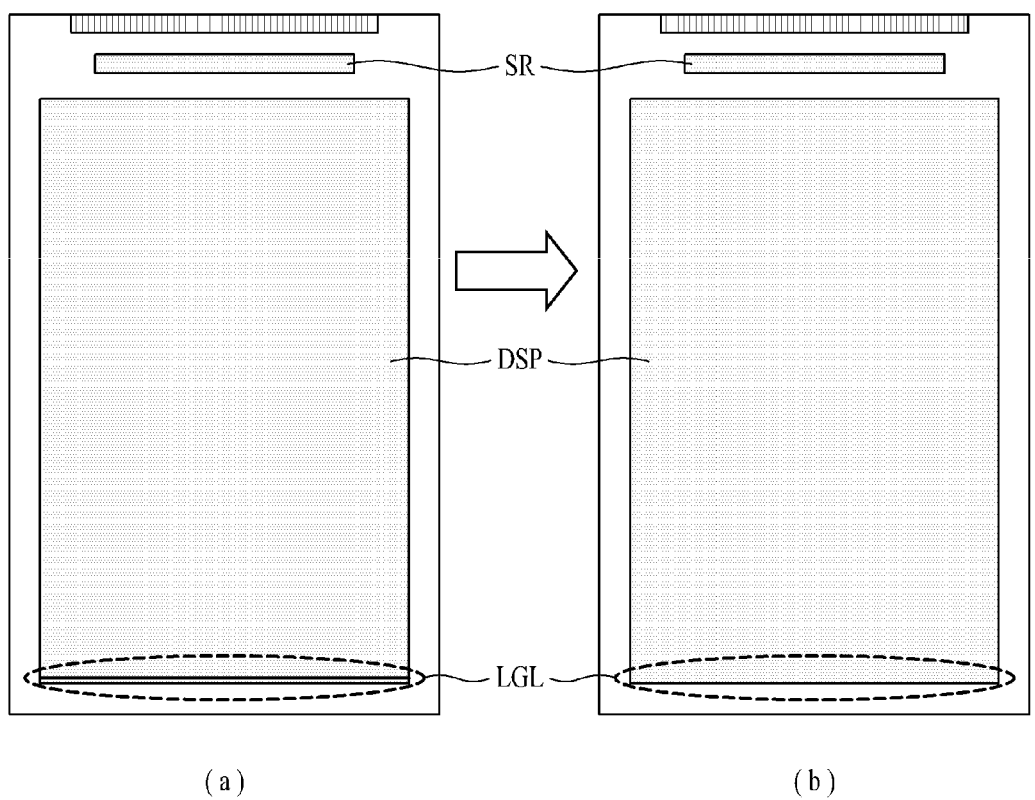

FIGS. 13 and 14 are views illustrating the effect of the present invention.

As shown in FIG. 13(a), after one scan pulse SP is output from a conventional last stage STn, another output MP (multi-output: output in a dotted circle) is generated therefrom. However, as shown in FIG. 13(b), after one scan pulse SP is output from a last stage STn of the present invention, no further output is generated therefrom.

As shown in FIG. 14(a), pixels connected to an end gate line emit light with higher luminance than other pixels due to a multi-output MP from a last stage STn of a conventional shift register SR. However, as shown in FIG. 14(b), pixels connected to an end gate line normally emit light with the same luminance as that of other pixels owing to generation of no multi-output MP from a last stage STn of a shift register SR of the present invention.

As is apparent from the above description, a bidirectional shift register according to the present invention has effects as follows.

In the present invention, only a first stage is set in forward driving and only a last stage is set in reverse driving, thereby preventing generation of a multi-output from any one stage in the forward driving and reverse driving.

Further, it is possible to improve picture quality of a display device employing this bidirectional shift register.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A bidirectional shift register comprising a plurality of stages for outputting scan pulses forward or reversely based on a start pulse and a plurality of clock pulses with a phase difference, the bidirectional shift register further comprising a start selector for supplying the start pulse to only a first one of the stages in a forward mode where the bidirectional shift register outputs the scan pulses forward, and to only a last one of the stages in a reverse mode where the bidirectional shift register outputs the scan pulses reversely, wherein the first stage outputs a corresponding one of the scan pulses first of all in the forward mode, wherein the last stage outputs a corresponding one of the scan pulses first of all in the reverse mode, wherein the first stage comprises:

a forward scan controller configured to make a set node active and a reset node inactive based on any one of the clock pulses and the start pulse from the forward selection switching device;

a reverse scan controller configured to make the set node active and the reset node inactive based on any one of the clock pulses and a scan pulse from a downstream stage; and an output unit configured to output any one of the corresponding scan pulse and a deactivation voltage based on a voltage at the set node and a voltage at the reset node.

2. The bidirectional shift register according to claim 1, wherein the start selector comprises:

a forward selection switching device controlled by a start selection signal and connected between a start transfer line transferring the start pulse and the first stage; and a reverse selection switching device controlled by the start selection signal and connected between the start transfer line and the last stage, wherein logic of the start selection signal when the bidirectional shift register is driven in the forward mode and logic of the start selection signal when the bidirectional shift register is driven in the reverse mode are opposite to each other, wherein the forward selection switching device and the reverse selection switching device are transistors of opposite types.

3. The bidirectional shift register according to claim 1, wherein the forward scan controller of the first stage comprises:

a first forward switching device controlled by the start pulse from the forward selection switching device supplied thereto and connected between an activation transfer line transferring an activation voltage and a first node;

at least one second forward switching device controlled by any one of the clock pulses supplied thereto and connected between the first node and the set node; and at least one third forward switching device controlled by the start pulse from the forward selection switching device and connected between the reset node and a deactivation transfer line transferring the deactivation voltage, wherein the start pulse supplied to the first forward switching device and the clock pulse supplied to the second forward switching device are in synchronization with each other.

4. The bidirectional shift register according to claim 3, wherein the reverse scan controller of the first stage comprises:

a first reverse switching device controlled by the scan pulse from the downstream stage supplied thereto and connected between the activation transfer line transferring the activation voltage and a second node;

at least one second reverse switching device controlled by any one of the clock pulses supplied thereto and connected between the second node and the set node; and at least one third reverse switching device controlled by the scan pulse from the downstream stage and connected between the reset node and the deactivation transfer line transferring the deactivation voltage, wherein the scan pulse supplied to the first reverse switching device and the clock pulse supplied to the second reverse switching device are in synchronization with each other.

5. The bidirectional shift register according to claim 1, wherein the first stage further comprises:

at least one first switching device controlled by the voltage at the reset node and connected between the set node and a deactivation transfer line transferring the deactivation voltage;

at least one second switching device controlled by any one of the clock pulses and connected between an activation transfer line transferring an activation voltage and the reset node; and at least one third switching device controlled by the voltage at the set node and connected between the reset node and the deactivation transfer line.

6. The bidirectional shift register according to claim 1, wherein the output unit of the first stage comprises:

a pull-up switching device controlled by the voltage at the set node and connected between a clock transfer line transferring any one of the clock pulses and an output terminal of the first stage; and a pull-down switching device controlled by the voltage at the reset node and connected between the output terminal and a deactivation transfer line transferring the deactivation voltage.

7. The bidirectional shift register according to claim 1, wherein the output unit of the first stage comprises:

a plurality of pull-up switching devices controlled by the voltage at the set node and connected in parallel between a clock transfer line transferring any one of the clock pulses and an output terminal of the first stage; and a plurality of pull-down switching devices controlled by the voltage at the reset node and connected in parallel between the output terminal and a deactivation transfer line transferring the deactivation voltage.

8. A bidirectional shift register comprising a plurality of stages for outputting scan pulses forward or reversely based on a start pulse and a plurality of clock pulses with a phase difference, the bidirectional shift register further comprising a start selector for supplying the start pulse to only a first one of the stages in a forward mode where the bidirectional shift register outputs the scan pulses forward, and to only a last one of the stages in a reverse mode where the bidirectional shift register outputs the scan pulses reversely, wherein the first stage outputs a corresponding one of the scan pulses first of all in the forward mode, wherein the last stage outputs a corresponding one of the scan pulses first of all in the reverse mode, wherein the last stage comprises:

a forward scan controller configured to make a set node active and a reset node inactive based on any one of the clock pulses and a scan pulse from an upstream stage;

a reverse scan controller configured to make the set node active and the reset node inactive based on any one of the clock pulses and the start pulse from the reverse selection switching device; and an output unit configured to output any one of the corresponding scan pulse and a deactivation voltage based on a voltage at the set node and a voltage at the reset node.

9. The bidirectional shift register according to claim 8, wherein the forward scan controller of the last stage comprises:

a first forward switching device controlled by the scan pulse from the upstream stage supplied thereto and connected between an activation transfer line transferring an activation voltage and a first node;

at least one second forward switching device controlled by any one of the clock pulses supplied thereto and connected between the first node and the set node; and at least one third forward switching device controlled by the scan pulse from the upstream stage and connected between the reset node and a deactivation transfer line transferring the deactivation voltage, wherein the scan pulse supplied to the first forward switching device and the clock pulse supplied to the second forward switching device are in synchronization with each other.

10. The bidirectional shift register according to claim 9, wherein the reverse scan controller of the last stage comprises:

a first reverse switching device controlled by the start pulse from the reverse selection switching device supplied thereto and connected between the activation transfer line transferring the activation voltage and a second node;

at least one second reverse switching device controlled by any one of the clock pulses supplied thereto and connected between the second node and the set node; and at least one third reverse switching device controlled by the start pulse from the reverse selection switching device and connected between the reset node and the deactivation transfer line transferring the deactivation voltage, wherein the start pulse supplied to the first reverse switching device and the clock pulse supplied to the second reverse switching device are in synchronization with each other.

11. The bidirectional shift register according to claim 8, wherein the last stage further comprises:

at least one first switching device controlled by the voltage at the reset node and connected between the set node and a deactivation transfer line transferring the deactivation voltage;

at least one second switching device controlled by any one of the clock pulses and connected between an activation transfer line transferring an activation voltage and the reset node; and at least one third switching device controlled by the voltage at the set node and connected between the reset node and the deactivation transfer line.

12. The bidirectional shift register according to claim 8, wherein the output unit of the last stage comprises:

a pull-up switching device controlled by the voltage at the set node and connected between a clock transfer line transferring any one of the clock pulses and an output terminal of the last stage; and a pull-down switching device controlled by the voltage at the reset node and connected between the output terminal and a deactivation transfer line transferring the deactivation voltage.

13. The bidirectional shift register according to claim 8, wherein the output unit of the last stage comprises:

a plurality of pull-up switching devices controlled by the voltage at the set node and connected in parallel between a clock transfer line transferring any one of the clock pulses and an output terminal of the last stage; and a plurality of pull-down switching devices controlled by the voltage at the reset node and connected in parallel between the output terminal and a deactivation transfer line transferring the deactivation voltage.

* * * * *